(12) United States Patent
Choi et al.

(10) Patent No.: US 11,009,999 B2
(45) Date of Patent: May 18, 2021

(54) DISPLAY DEVICE HAVING OPENING AND TOUCH SENSOR

(71) Applicant: SAMSUNG DISPLAY CO., LTD., Yongin-si (KR)

(72) Inventors: Wonjun Choi, Yongin-si (KR); Iljoo Kim, Yongin-si (KR); Duckjoong Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/443,124

(22) Filed: Jun. 17, 2019

(65) Prior Publication Data

US 2020/0133415 A1 Apr. 30, 2020

(30) Foreign Application Priority Data

Oct. 26, 2018 (KR) .......................... 10-2018-0129358

(51) Int. Cl.
*G06F 3/044* (2006.01)
*H01L 27/32* (2006.01)

(52) U.S. Cl.
CPC ............ *G06F 3/044* (2013.01); *H01L 27/323* (2013.01)

(58) Field of Classification Search
CPC . G06F 2203/04107; G06F 2203/04111; G06F 2203/04112; G06F 3/0412; G06F 3/04164; G06F 3/044; G06F 3/0445; G06F 3/0446; G06F 3/0448; H01L 27/323
See application file for complete search history.

(56) References Cited

U.S. PATENT DOCUMENTS

| | | | |
|---|---|---|---|
| 8,416,545 B2 | 4/2013 | Kim et al. | |
| 10,067,615 B2 | 9/2018 | Kim et al. | |
| 10,171,636 B2 | 1/2019 | Yeo et al. | |
| 10,691,277 B2 | 6/2020 | Xie et al. | |
| 2010/0123846 A1 | 5/2010 | Kim et al. | |
| 2015/0060256 A1* | 3/2015 | Kim ........................ | G06F 3/044 200/600 |
| 2016/0299611 A1 | 10/2016 | Park | |
| 2017/0154566 A1 | 6/2017 | Ryoo et al. | |
| 2017/0237037 A1* | 8/2017 | Choi ..................... | G04B 19/04 257/40 |
| 2018/0129330 A1 | 5/2018 | Ding et al. | |
| 2020/0243794 A1* | 7/2020 | Jones .................. | H01L 27/3234 |

FOREIGN PATENT DOCUMENTS

| | | |
|---|---|---|
| CN | 107145266 | 9/2017 |
| KR | 10-2010-0055709 A | 5/2010 |
| KR | 10-1101430 A1 | 12/2011 |
| KR | 10-2015-0025638 A | 3/2015 |
| KR | 10-2016-0035658 A | 4/2016 |
| KR | 10-2016-0121659 A | 10/2016 |
| KR | 10-2017-0112790 A | 10/2017 |

* cited by examiner

*Primary Examiner* — Chun-Nan Lin
(74) *Attorney, Agent, or Firm* — Kile Park Reed & Houtteman PLLC

(57) ABSTRACT

A display device includes a display panel including an opening penetrating the display panel, a display area adjacent to the opening, a first non-display area between the opening and the display area, and a second non-display area surrounding the display area, and an input detecting layer on the display panel. The input detecting layer may include a first line located in the first non-display area, a second line located in the second non-display area, and a connecting line connecting the first line to the second line.

18 Claims, 32 Drawing Sheets

DISPLAY DEVICE HAVING OPENING AND TOUCH SENSOR

CROSS-REFERENCE TO RELATED APPLICATION

Korean Patent Application No. 10-2018-0129358, filed on Oct. 26, 2018, in the Korean Intellectual Property Office, and entitled: "Display Device," is incorporated by reference herein in its entirety.

BACKGROUND

1. Field

Embodiments relate to display devices, and more particularly, to a display device including an open region or an opening.

2. Description of the Related Art

Recently, the use of display devices has been diversified. Also, the range of use of the display devices is expanding as the thicknesses and weights of the display devices are decreasing.

SUMMARY

Embodiments are directed to a display device, including a display panel including an opening penetrating the display panel, a display area surrounding the opening, a first non-display area between the opening and the display area, and a second non-display area surrounding the display area, and an input detecting layer on the display panel. The input detecting layer may include a first line located in the first non-display area, a second line located in the second non-display area, and a connecting line connecting the first line to the second line.

The second line may have a voltage level of a constant voltage.

The first line may have a ring shape surrounding the opening.

The input detecting layer may include first detecting electrodes arranged in a first direction, and second detecting electrodes arranged in a second direction crossing the first direction, the first detecting electrodes and the second detecting electrodes being located in the display area.

The input detecting layer may include a first conductive layer, a first insulating layer on the first conductive layer, a second conductive layer on the first insulating layer and including the first detecting electrodes and the second detecting electrodes, and a second insulating layer on the second conductive layer.

The first conductive layer or the second conductive layer may include the connecting line.

The connecting line may include a same material as the first detecting electrodes and the second detecting electrodes.

The first conductive layer may include at least one of the first line or the second line, and the connecting line may be connected to the at least one of the first line or the second line via a contact hole of the first insulating layer.

The connecting line may be located below the first detecting electrodes and the second detecting electrodes with the first insulating layer therebetween.

The connecting line may be located in a gap between neighboring detecting electrodes among the first detecting electrodes and the second detecting electrodes.

The connecting line may overlap at least one of the first detecting electrodes or the second detecting electrodes.

The display device may further include a connecting electrode sector connecting neighboring first detecting electrodes among the first detecting electrodes or neighboring second detecting electrodes among the second detecting electrodes, the connecting electrode sector being located in the first non-display area.

Embodiments are also directed to a display device, including a substrate including an opening penetrating the substrate, a display area, a first non-display area between the opening and the display area, and a second non-display area spaced apart from the first non-display area with the display area therebetween, a plurality of display elements arranged in the display area, an encapsulation member covering the plurality of display elements, first detecting electrodes arranged on the encapsulation member in a first direction, second detecting electrodes arranged on the encapsulation member in a second direction crossing the first direction, and a first line arranged on the encapsulation member and surrounding the opening in the first non-display area.

The first line may have a voltage level of a constant voltage.

The display device may further include a second line in the second non-display area, and a connecting line connecting the first line to the second line.

The connecting line may be located on a same layer as the first detecting electrodes.

The display device may further include an insulating layer provided between the connecting line and any one of the first line and the second line. The connecting line may be connected to the any one of the first line and the second line via a contact hole of the insulating layer.

The connecting line may be located on a same layer as any one of the first line and the second line.

The connecting line may include a metal layer.

The connecting line may be located in a gap between neighboring detecting electrodes among the first detecting electrodes and the second detecting electrodes.

The connecting line may overlap at least one of the first detecting electrodes or the second detecting electrodes.

The first detecting electrodes and the second detecting electrodes may respectively include a transparent conductive layer.

The first line may include a material different from the first detecting electrodes and the second detecting electrodes.

The first detecting electrodes and the second detecting electrodes may respectively include a metal layer.

The display device may further include a connecting electrode sector connecting neighboring first detecting electrodes among the first detecting electrodes or neighboring second detecting electrodes among the second detecting electrodes.

BRIEF DESCRIPTION OF THE DRAWINGS

Features will become apparent to those of skill in the art by describing in detail example embodiments with reference to the attached drawings in which.

DETAILED DESCRIPTION

Figure 1:
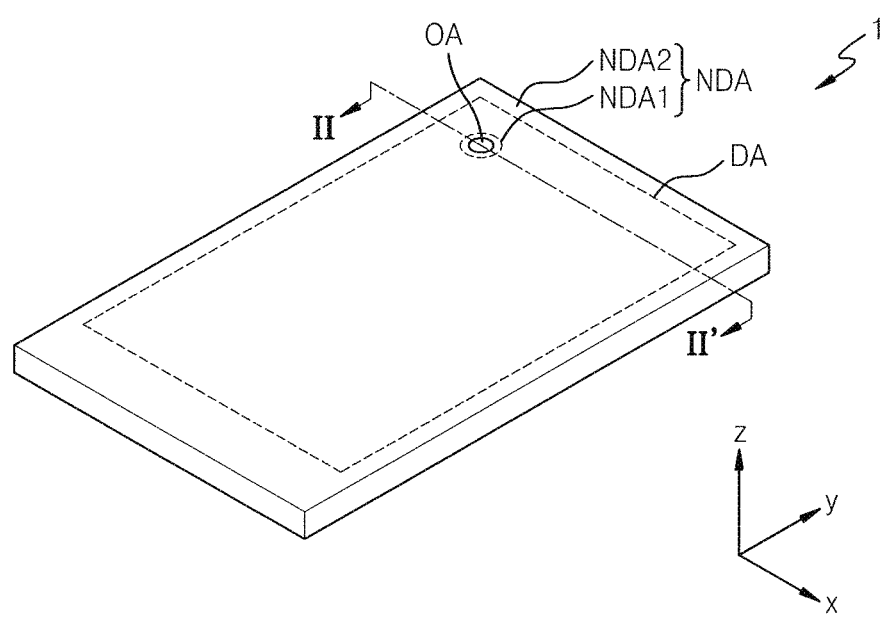
FIG. 1 illustrates a perspective view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

While such terms as "first", "second", etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that terms such as "including" or "having," etc., are intended to indicate the existence of features or components, and are not intended to preclude the possibility that one or more other features or components may exist or may be added.

It will be understood that when a component or layer is referred to as being "on" another component or layer, the component or layer can be directly on another component or layer or intervening component or layers.

When a certain embodiment may be implemented differently, a specific process order may be performed differently from the described order. For example, two consecutively described processes may be performed substantially at the same time or performed in an order opposite to the described order.

It will be understood that when a layer, region, or component is connected to another layer, region, or component, the layers, regions or components may not only be directly connected, but may also be indirectly connected via another layer, region, or component therebetween. For example, in the specification, when a layer, region, or component is electrically connected to another layer, region, or component, the layers, regions, or components may not only be directly electrically connected, but may also be indirectly electrically connected via another layer, region, or component therebetween.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

FIG. 1 is a perspective view of a display device 1 according to an example embodiment.

Referring to FIG. 1, the display device 1 includes a display area DA emitting light and a non-display area NDA not emitting light, the non-display area NDA being adjacent to the display area DA. The display device 1 may provide an image by using light emitted from a plurality of pixels arranged in the display area DA.

The display device 1 may include an opening area (or a first area) OA at least partially surrounded by the display area (or a second area) DA. Referring to FIG. 1, in an example embodiment, the opening area OA may be entirely surrounded by the display area DA. The opening area OA may be defined or surrounded by a plurality of pixels which are arranged in the display area DA. The non-display area NDA may include a first non-display area (or a middle area, a third area) NDA1 surrounding the opening area OA and a second non-display area (or peripheral area, a fourth area) NDA2 surrounding outside the display area DA. The first non-display area NDA1 located between the opening area OA and the display area DA may entirely surround the opening area OA, the display area DA may entirely surround the first non-display area NDA1, and the second non-display area NDA2 may entirely surround the display area DA.

Hereinafter, an organic light-emitting display device is described as an example of the display device 1 according to an example embodiment. As another example, various types of display devices, such as an inorganic light-emitting display device (or an inorganic electroluminescent (EL) display device), a quantum dot light-emitting display, a liquid crystal display, etc., may be used.

Figure 2:
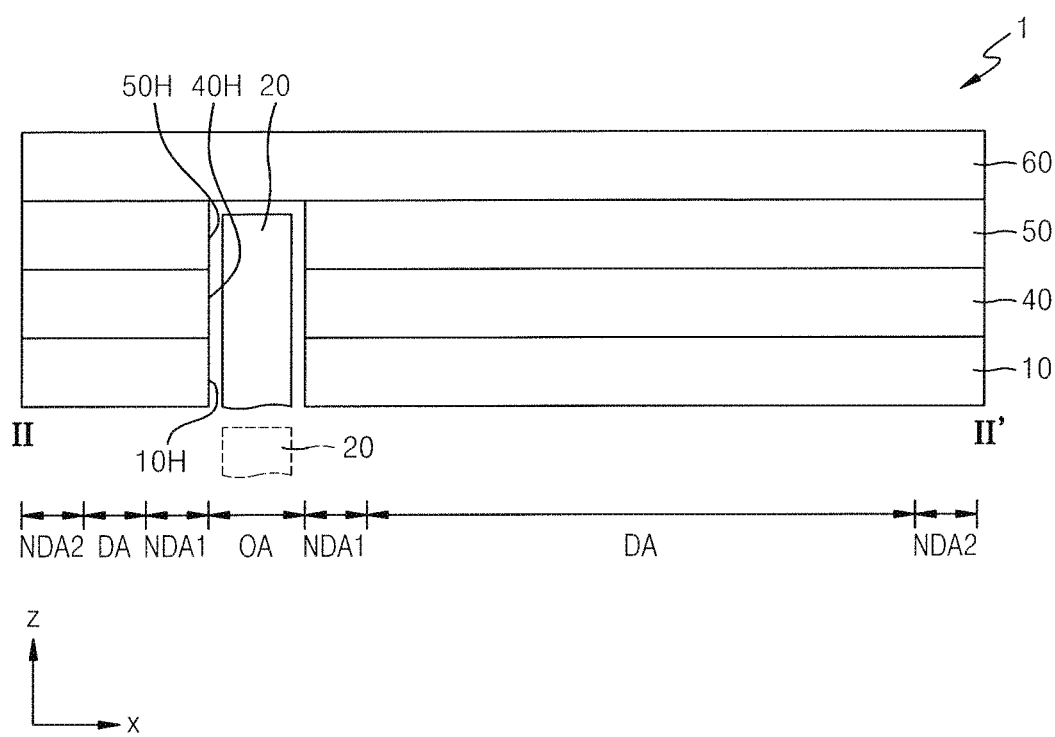
FIG. 2 illustrates a cross-sectional view of the display device according to an example embodiment.

FIG. 2 is a cross-sectional view of the display device 1 according to an example embodiment, taken along a line II-IF of FIG. 1.

Referring to FIG. 2, the display device 1 may include a display panel 10, an input detecting layer 40 arranged on the display panel 10, and an optical functional layer 50, all of which may be covered by a window 60. The display device 1 may be any one of various electronic devices, such as a mobile phone, a laptop computer, and a smart watch.

The display panel 10 may display an image. The display panel 10 may include pixels, arranged in the display area DA, that each include a display element and a pixel circuit connected thereto. The display element may include an organic light-emitting diode, an inorganic light-emitting diode, a quantum dot light-emitting diode, or the like.

The input detecting (sensing) layer 40 may obtain an external input, for example, coordinate information according to a touch event. The input detecting layer 40 may include a detecting electrode (a sensing electrode or a touch electrode) and trace lines connected to the detecting electrode. The input detecting layer 40 may be arranged on the display panel 10. The input detecting layer 40 may detect an external input via, for example, a mutual capacitance method and/or a self-capacitance method.

The input detecting layer 40 may be formed directly on the display panel 10, or may be separately formed and then combined to the display panel 10 via an adhesive layer, such as optical clear adhesive (OCA). For example, the input detecting layer 40 may be consecutively formed after a process of forming the display panel 10, and in this case, the adhesive layer may not be provided between the input detecting layer 40 and the display panel 10. In FIG. 2, the input detecting layer 40 is provided between the display panel 10 and the optical functional layer 50, but in another example embodiment, the input detecting layer 40 may be arranged on the optical functional layer 50.

The optical function layer 50 may include an antireflection layer. The antireflection layer may reduce reflectance of light (external light) incident from the outside of the display device 1 through the window 60 towards the display panel 10. The antireflection layer may include, for example, a retarder and a polarizer. The retarder may be of a film type or a liquid crystal coating type, and may include a 2/2 retarder and/or a 214 retarder. The polarizer may also be of a film type or a liquid crystal type. The film type polarizer may include an elongating synthetic resin film, and the liquid crystal type polarizer may include liquid crystals arranged in a certain arrangement. The retarder and the polarizer may further include a protective film. The retarder and the polarizer themselves or the protective film may be defined as a base layer of the antireflection layer.

In another example embodiment, the antireflection layer may include a black matrix and color filters. The color filters may be arranged considering colors of light emitted from each of the pixels of the display panel 10. In another example embodiment, the antireflection layer may include a destructive interference structure. The destructive interference structure may include a first reflective layer and a second reflective layer, which are arranged on different layers. First reflected light and second reflected light respectively reflected from the first reflective layer and the second reflective layer may create destructive interference, and thus external light reflectance may be reduced.

The optical functional layer 50 may include a lens layer. The lens layer may improve light output efficiency of light emitted from the display panel 10, or reduce color deviation. The lens layer may include a layer having a convex or concave lens shape and/or a plurality of layers having different refractive indices. The optical functional layer 50 may include both or any one of the antireflection layer and the lens layer described above.

The display panel 10, the input detecting layer 40, and/or the optical functional layer 50 may include an opening, which may completely penetrate the display panel 10, the input detecting layer 40, and/or the optical functional layer 50. In this regard, FIG. 2 illustrates an example embodiment in which the display panel 10, the input detecting layer 40, and the optical functional layer 50 respectively include first, second, and third openings 10H, 40H, and 50H. The display panel 10 includes the first opening 10H that passes or penetrates from a top surface to a bottom surface of the display panel 10. The input detecting layer 40 includes the second opening 40H that passes or penetrates from a top surface to a bottom surface of the input detecting layer 40. The optical functional layer 50 includes the third opening 50H that passes or penetrates from a top surface to a bottom surface of the optical functional layer 50. The first, second, and third openings 10H, 40H, and 50H may overlap each other. The first, second, and third openings 10H, 40H, and 50H are located to correspond to the opening area OA. In another example embodiment, at least one of the display panel 10, the input detecting layer 40, or the optical functional layer 50 may not include an opening. For example, one or more components selected among the display panel 10, the input detecting layer 40, and the optical functional layer 50 may not include an opening.

A component 20 may correspond to the opening area OA. The component 20 may be located in the first, second, and/or third openings 10H, 40H, and 5011 as indicated by a solid line in FIG. 2, or may be arranged below the display panel 10 as indicated by a broken line in FIG. 2.

The component 20 may include an electronic element. For example, the component 20 may be an electronic component using light or sound. For example, the electronic element may include a sensor receiving and using light, such as an infrared sensor, a camera capturing an image by receiving light, a sensor measuring a distance by outputting and detecting light or sound, or recognizing a fingerprint, a small lamp outputting light, or a speaker outputting sound. When the electronic element uses light, the electronic element may use light of various wavelength bands, such as visible light, infrared light, ultraviolet light, etc. According to some embodiments, the opening area OA may be understood as a transmission area through which light and/or sound output from the component 20 or proceeding towards the electronic element are transmittable.

In another example embodiment, when the display device 1 is used as a smart watch or a dashboard, the component 20 may be a member including a clock hand or a needle indicating certain information (for example, a vehicle speed). When the display device 1 includes the clock hand or the dashboard, the component 20 may be externally exposed through the window 60, and the window 60 may include an opening corresponding to the opening area OA.

The component 20 may include a component(s) related to functions of the display panel 10 as described above, or may include a component, such as an accessory for increasing aesthetic sense of the display panel 10. Although not shown in FIG. 2, a layer including an optical transparent adhesive or the like may be located between the window 60 and the optical functional layer 50.

Figure 3A:
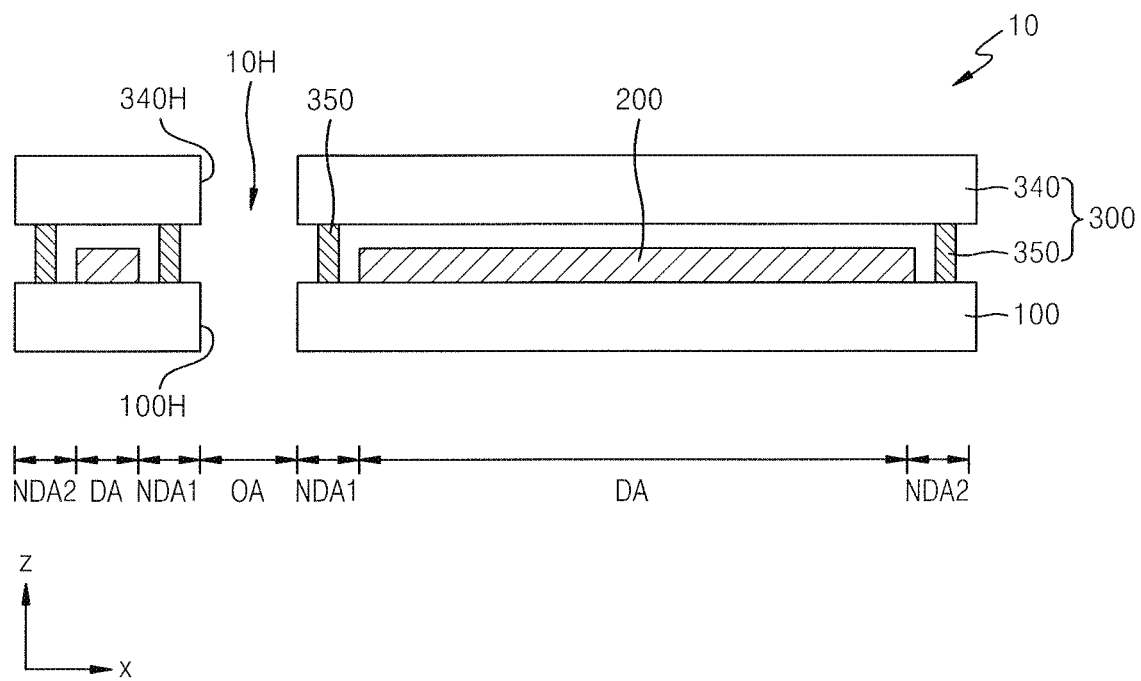
FIGS. 3A through 3C illustrate cross-sectional views of a display panel according to example embodiments.
Figure 3B:
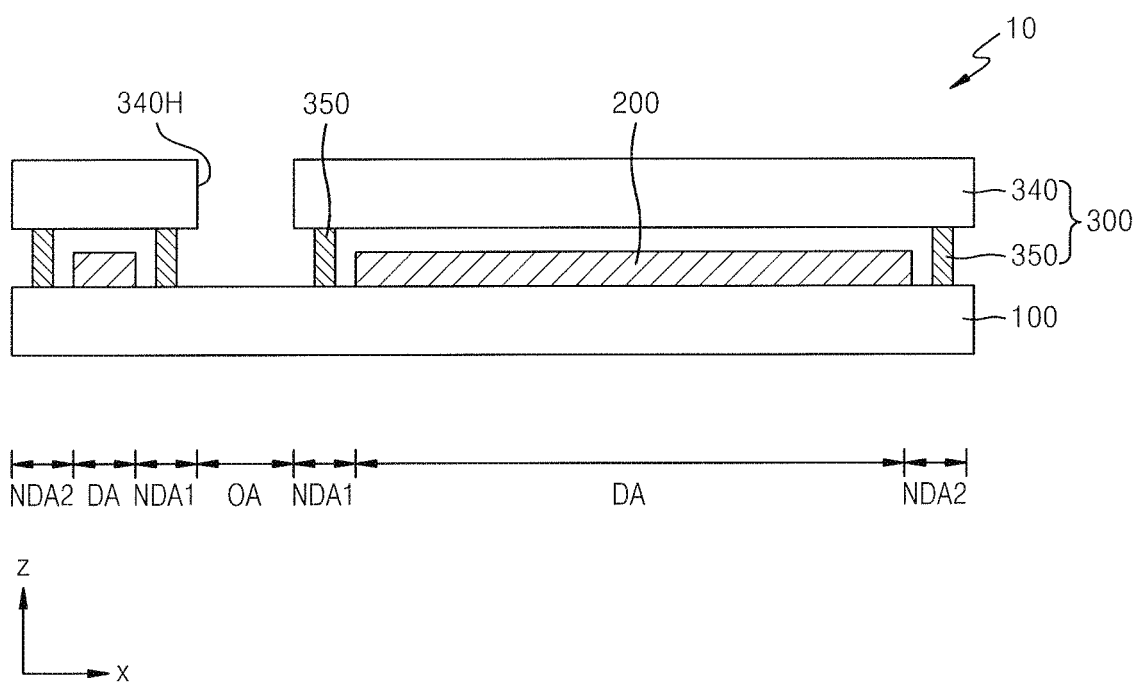
Figure 3C:
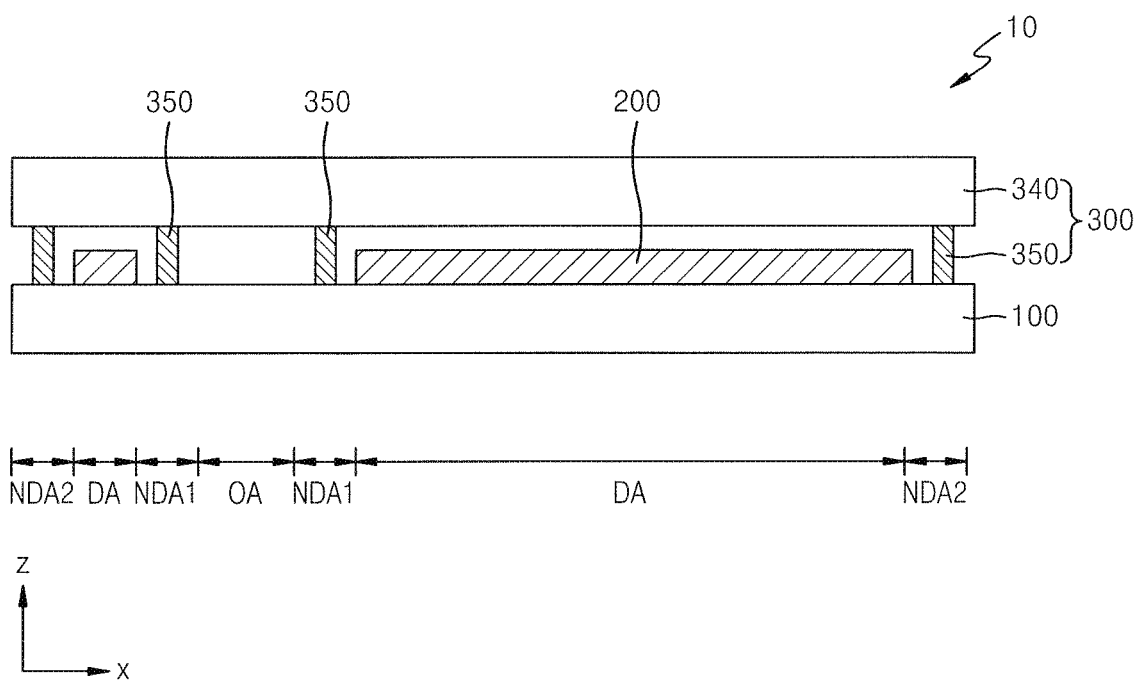

FIGS. 3A through 3C are cross-sectional views of the display panel 10 according to example embodiments.

In the example embodiments illustrated in FIGS. 3A through 3C, the display panel 10 includes a display element layer 200 arranged on a substrate 100, and located to correspond to the display area DA and including a plurality of pixels. The substrate 100 may include a glass material or a polymer resin. For example, the substrate 100 may include a glass material mainly containing $SiO_2$, or a resin such as reinforced plastic.

The display element layer 200 may include a pixel circuit corresponding to each pixel and a display element electrically connected to the pixel circuit. The pixel circuit may include a thin-film transistor and a storage capacitor. The display element may include an organic light-emitting diode.

The display panel 10 may include an encapsulation substrate 340, as an encapsulation member 300, facing the substrate 100. A sealing material 350 may be provided between the substrate 100 and the encapsulation substrate 340. The sealing material 350 may surround the display element layer 200 between the substrate 100 and the encapsulation substrate 340. For example, a portion of the sealing material 350 that is located in the first non-display area NDA1 may surround a first edge (inner edge) of the display element layer 200. Another portion of the sealing material 350 that is located in the second non-display area NDA2 may surround a second edge (outer edge) of the display element layer 200. When viewed from a direction perpendicular to a main surface, the opening area OA may be entirely surrounded by the portion of the sealing material 350, and the second edge of the display element layer 200 may be entirely surrounded by the other portion of the sealing material 350.

The display panel 10 may include the first opening 10H corresponding to the opening area OA. In this regard, FIG. 3A illustrates that the substrate 100 and the encapsulation substrate 340 respectively include through holes 100H and 340H corresponding to the opening area OA. The display element layer 200 may also include a through hole corresponding to the opening area OA.

In another example embodiment, as shown in FIG. 3B, the encapsulation substrate 340 includes the through hole 340H corresponding to the opening area OA, but the substrate 100 may not include a through hole. The display element layer 200 may also include a through hole corresponding to the opening area OA. In another example embodiment, as shown in FIG. 3C, the substrate 100 and the encapsulation substrate 340 may not include a through hole corresponding to the opening area OA. The display element layer 200 may include a through hole corresponding to the opening area OA. Also, as another example embodiment, the sealing material 350 provided in the first non-display area NDA1 in the display panel 10 of FIG. 3C may be omitted. Also, the display element layer 200 may not include a through hole corresponding to the opening area OA, and the component 20 of FIG. 2 that does not require high transmittance may be provided in the opening area OA such that the opening area OA may be used as a transmission area through which light of the component 20 is penetrated. Even when the display element layer 200 does not include a through hole corresponding to the opening area OA, a region of the display element layer 200 corresponding to the opening area OA may secure transmittance by not including components (for example, a transistor, a storage capacitor, and a wire) of a pixel circuit (e.g., a pixel circuit PC of FIG. 6).

Figure 4A:
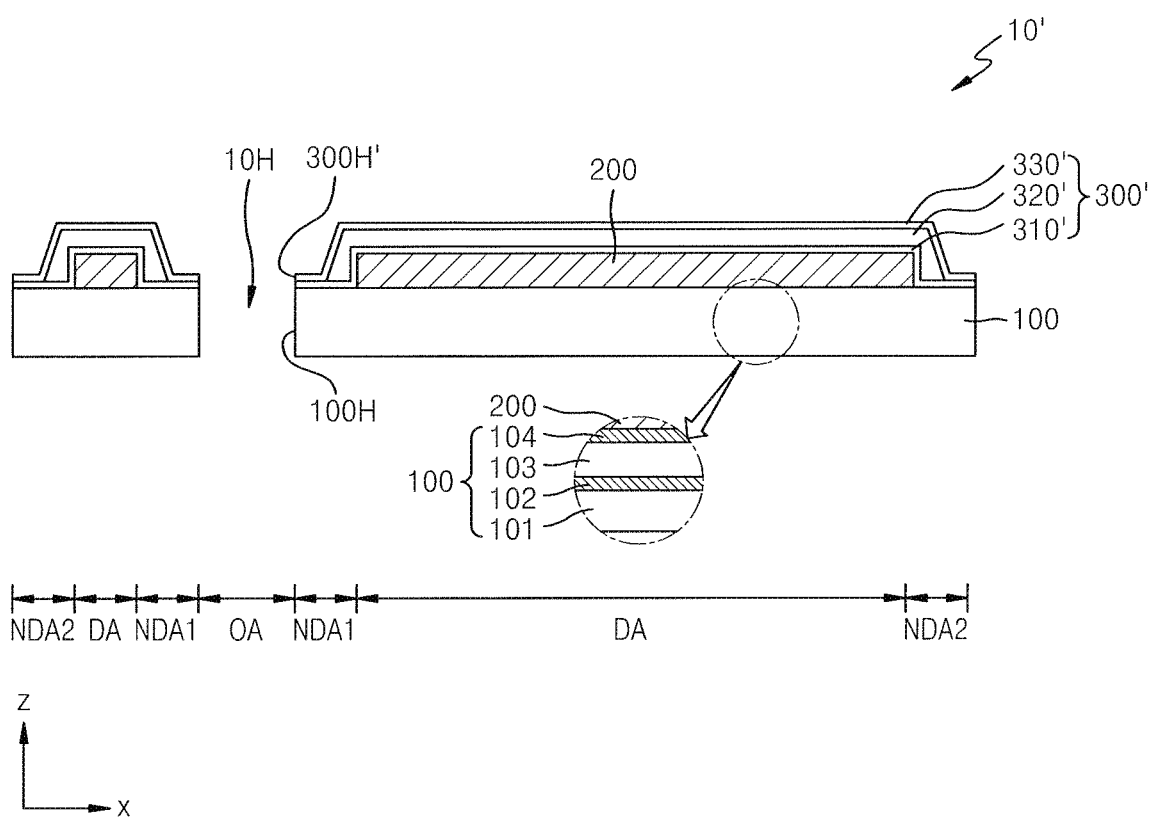
FIGS. 4A through 4C illustrate cross-sectional views of a display panel according to other embodiments.
Figure 4B:
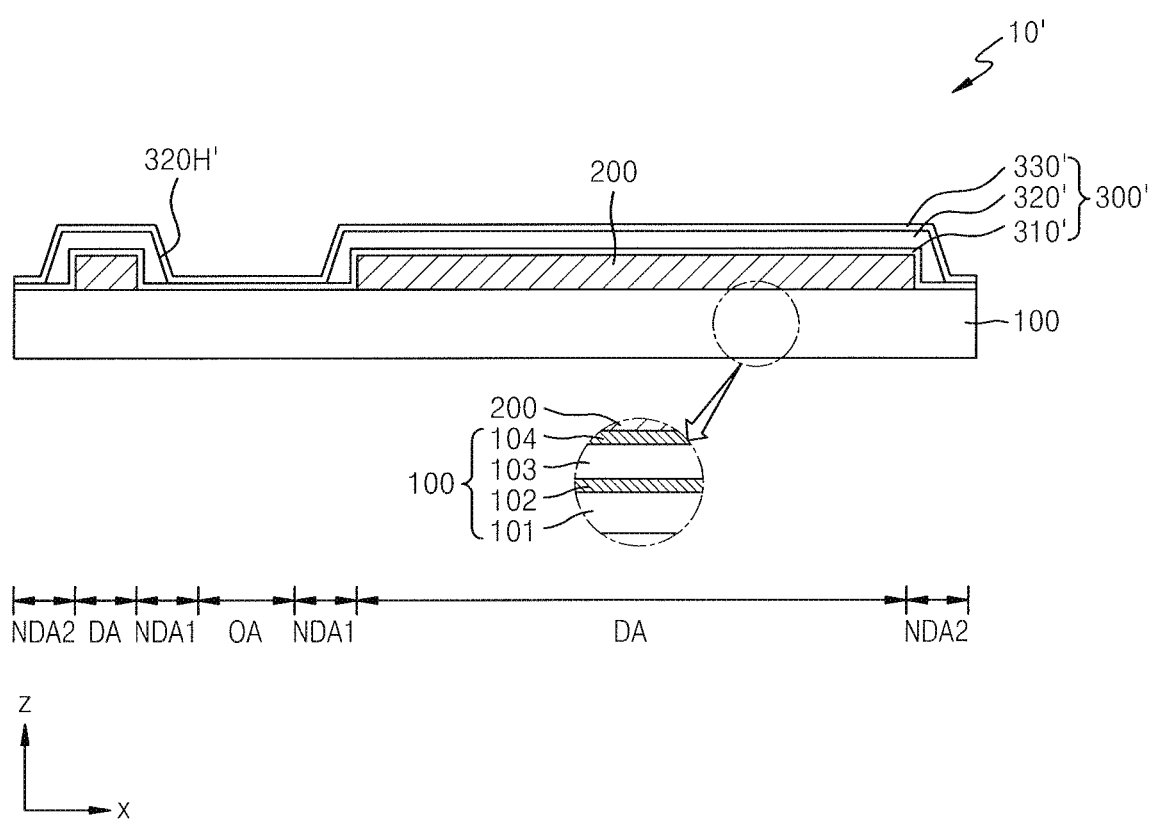
Figure 4C:
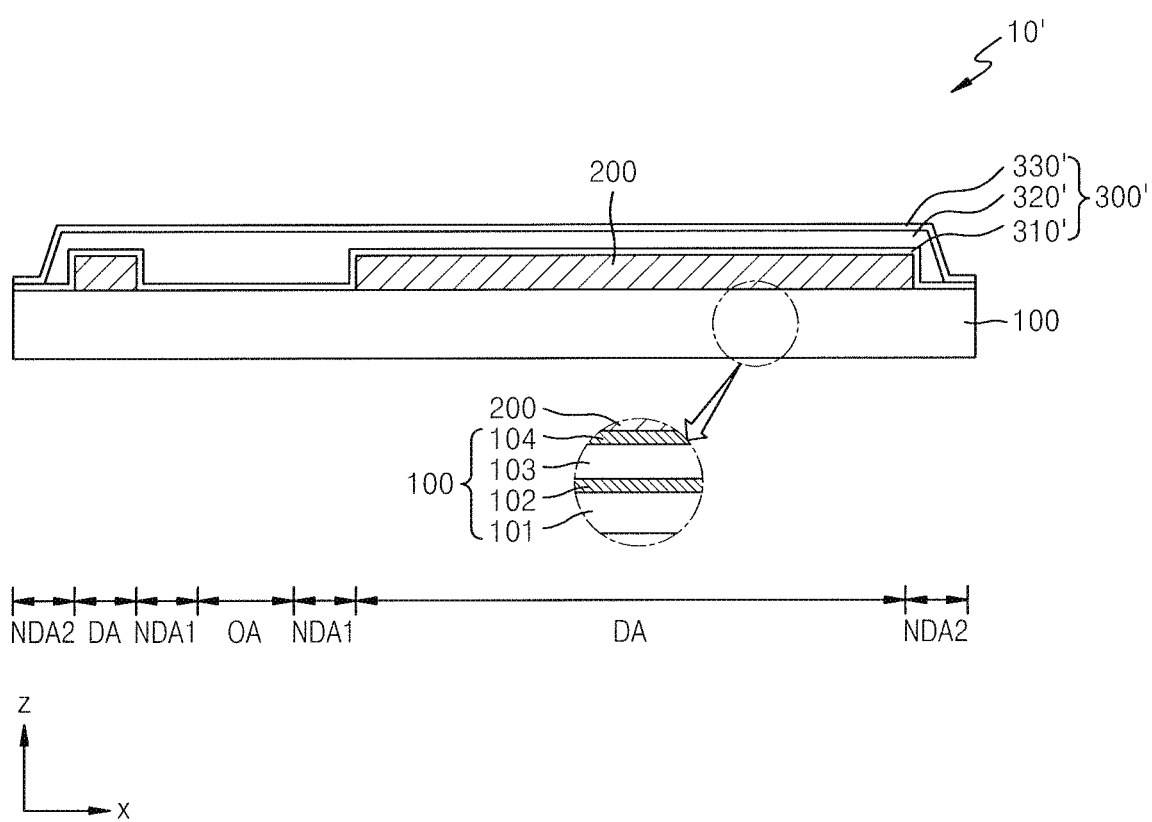

FIGS. 4A through 4C are cross-sectional views of a display panel 10' according to other example embodiments.

In the example embodiment illustrated in FIG. 4A, the display element layer 200 is on the substrate 100. The display element layer 200 may be covered by a thin-film encapsulation layer as an encapsulation member 300'. The encapsulation member 300' as the thin-film encapsulation layer may include at least one inorganic encapsulation layer and at least one organic encapsulation layer. In the example embodiment illustrated in FIG. 4A, the encapsulation member 300' includes first and second inorganic encapsulation layers 310' and 330', and an organic encapsulation layer 320' therebetween.

The first and second inorganic encapsulation layers 310' and 330' may each include at least one inorganic insulating material. The inorganic insulating material may include, for example, aluminum oxide, titanium oxide, tantalum oxide, hafnium oxide, zinc oxide, silicon oxide, silicon nitride, and/or silicon oxynitride. The organic encapsulation layer 320' may include, for example, a polymer-based material such as an acryl-based resin, an epoxy-based resin, a polyimide, a polyethylene, etc.

The substrate 100 may include polymer resin. The substrate 100 may be a multilayer. For example, the substrate 100 may include a first base layer 101, a first barrier layer 102, a second base layer 103, and a second barrier layer 104, which are sequentially stacked in the stated order.

The first and second base layers 101 and 103 may each include polymer resin. For example, the first and second base layers 101 and 103 may each include polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), or the like. The polymer resin may be transparent.

The first and second barrier layers 102 and 104 may each be a barrier layer preventing penetration of external impurities and may be a single layer or a multilayer including, for example, silicon nitride ($SiN_x$) and/or silicon oxide ($SiO_x$).

When the display panel 10' includes the substrate 100 that is a multilayer and the encapsulation member 300 that is a thin-film encapsulation layer, flexibility of the display panel 10' may be improved.

In the example embodiment illustrated in FIG. 4A, through holes 100H and 300H' respectively penetrating the substrate 100 and the encapsulation member 300' (thin-film encapsulation layer) are provided corresponding to the first opening 10H of the display panel 10'. The display element layer 200 may also include a through hole corresponding to the opening area OA.

In another example embodiment, as shown in FIG. 4B, the organic encapsulation layer 320' in the encapsulation member 300' (thin-film encapsulation layer) includes a through hole 320H' corresponding to the opening area OA, but the substrate 100 and the first and second inorganic encapsulation layers 310' and 330' may not include a through hole. In another example embodiment, as shown in FIG. 4C, layers in the encapsulation member 300' (thin-film encapsulation layer) may not include a through hole corresponding to the opening area OA. Thus, the first and second inorganic encapsulation layers 310' and 330' and the organic encapsulation layer 320' may cover the opening area OA. In another example embodiment, when the opening area OA is used as a transmission area through which light penetrates, for example, when the component 20 of FIG. 2 that does not require high transmittance is provided in the opening area OA, the display element layer 200 may not include a through hole corresponding to the opening area OA unlike as shown in FIGS. 4A through 4C. Even when the display element layer 200 does not include a through hole corresponding to the opening area OA, a region of the display element layer 200 corresponding to the opening area OA may secure transmittance by not including components (for example, a transistor, a storage capacitor, and a wire) forming the pixel circuit PC of FIG. 6.

Figure 5:
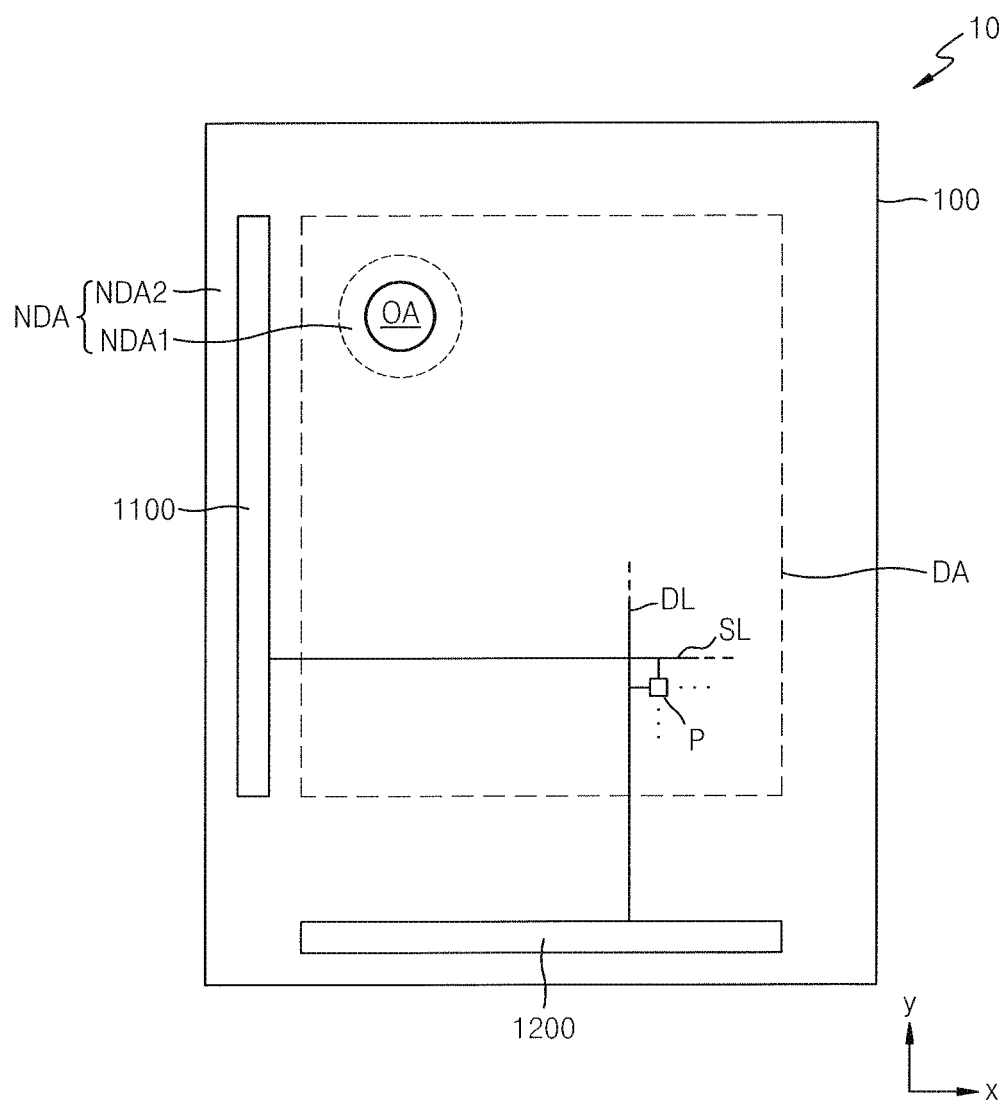
FIG. 5 illustrates a plan view of a display panel according to an example embodiment.
Figure 6:
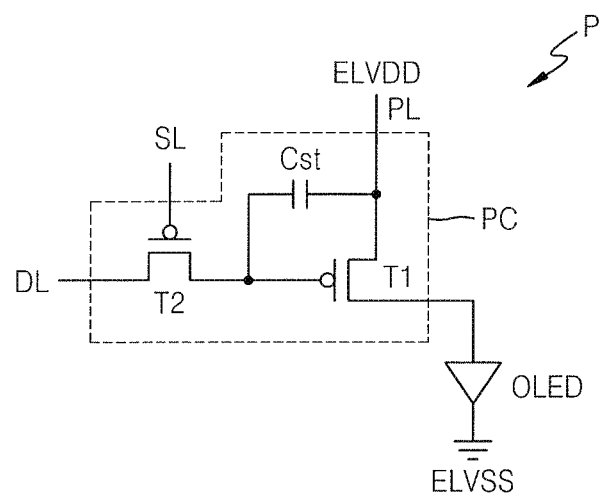
FIG. 6 illustrates an equivalent circuit diagram of one pixel of a display panel.

FIG. 5 is a plan view of the display panel 10 according to an example embodiment, and FIG. 6 is an equivalent circuit diagram of one pixel P of the display panel 10.

Referring to FIG. 5, the display panel 10 includes the display area DA and the first and second non-display areas NDA1 and NDA2. FIG. 5 may be understood as a view of the substrate 100 in the display panel 10. For example, it may be understood that the substrate 100 includes the opening area OA, the display area DA, and the first and second non-display areas NDA1 and NDA2.

The display panel 10 includes the plurality of pixels P arranged in the display area DA. As shown in FIG. 6, each pixel P includes the pixel circuit PC and, as a display component connected to the pixel circuit PC, an organic light-emitting diode OLED. The pixel circuit PC may include a first thin-film transistor T1, a second thin-film transistor T2, and a storage capacitor Cst. Each pixel P may emit, for example, red, green, or blue light, or may emit red, green, blue, or white light, from the organic light-emitting diode OLED.

In the example embodiment illustrated in FIG. 6, the second thin-film transistor T2 is a switching thin-film transistor, is connected to a scan line SL and a data line DL, and may transmit a data voltage input from the data line DL to the first thin-film transistor T1 according to a switching voltage input from the scan line SL. The storage capacitor Cst may be connected to the second thin-film transistor T2 and a driving voltage line PL and may store a voltage corresponding to a difference between a voltage received from the second thin-film transistor T2 and a first power voltage ELVDD supplied to the driving voltage line PL.

In the example embodiment illustrated in FIG. 6, the first thin-film transistor T1 is a driving thin-film transistor, is connected to the driving voltage line PL and the storage capacitor Cst, and may control a driving current flowing from the driving voltage line PL to the organic light-emitting diode OLED based on a voltage value stored in the storage capacitor Cst. The organic light-emitting diode OLED may emit light having certain luminance according to a driving voltage. An opposite electrode (for example, a cathode) of the organic light-emitting diode OLED may receive a second power voltage ELVSS.

In FIG. 6, the pixel circuit PC includes two thin-film transistors and one storage capacitor, but the number of thin-film transistors and the number of storage capacitors may vary according to a design of the pixel circuit PC.

Referring back to FIG. 5, the first non-display area NDA1 may surround the opening area OA. In the present example embodiment, the first non-display area NDA1 is an area where a display element, such as an organic light-emitting diode emitting light, is not arranged, and signal lines providing signals to the pixels P provided around the opening area OA may be located in the first non-display area NDA1. A scan driver 1100 providing a scan signal to each pixel P, a data driver 1200 providing a data signal to each pixel P, a main power lines (not shown) for providing first and second power voltages, etc., may be arranged in the second non-display area NDA2. In FIG. 5, the data driver 1200 is arranged adjacent to one side surface of the substrate 100, but according to another example embodiment, the data driver 1200 may be arranged on a flexible printed circuit board (FPCB) electrically connected to a pad arranged at one side of the display panel 10.

Figure 7:
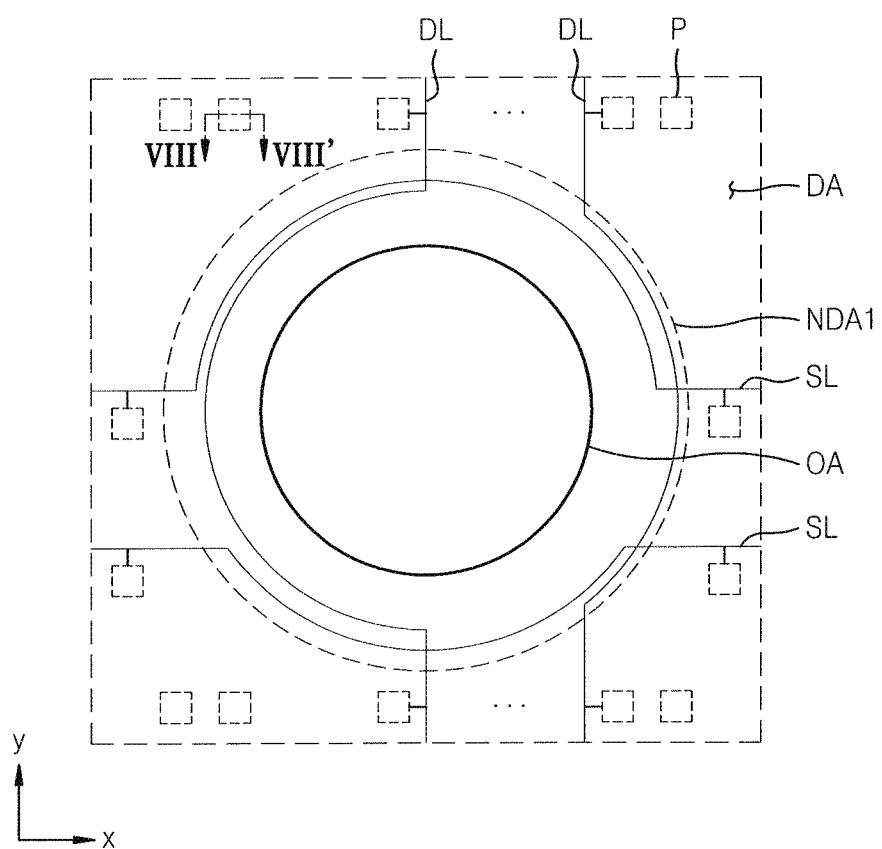
FIG. 7 illustrates a plan view of a part of a display panel, according to an example embodiment.

FIG. 7 is a plan view of a part of a display panel, according to an example embodiment, and illustrates signal lines located in the first non-display area NDA1.

Referring to FIG. 7, the pixels P are arranged in the display area DA around the opening area OA, and the first non-display area NDA1 may be located between the opening area OA and the display area DA.

The pixels P may be spaced apart from each other around the opening area OA. On a plane, the pixels may be are arranged at the upper and lower based on the opening area OA, and the pixels P may be arranged at the left and right based on the opening area OA. The opening area OA may be located between the pixels P.

Among signal lines supplying signals to the pixels P, signal lines adjacent to the opening area OA may detour or bypass around the opening area OA. Some of the data lines DL passing the display area DA may extend in a y-direction to provide data signals to the pixels P arranged at the upper and lower of the opening area OA, while detouring or bypassing along an edge of the display area OA in the first non-display area NDA1. Some of the scan lines SL passing the display area DA may extend in an x-direction to provide scan signals to the pixels P arranged at the left and right of the opening area OA, while detouring or bypassing along an edge of the opening area OA in the first non-display area NDA1.

Figure 8:
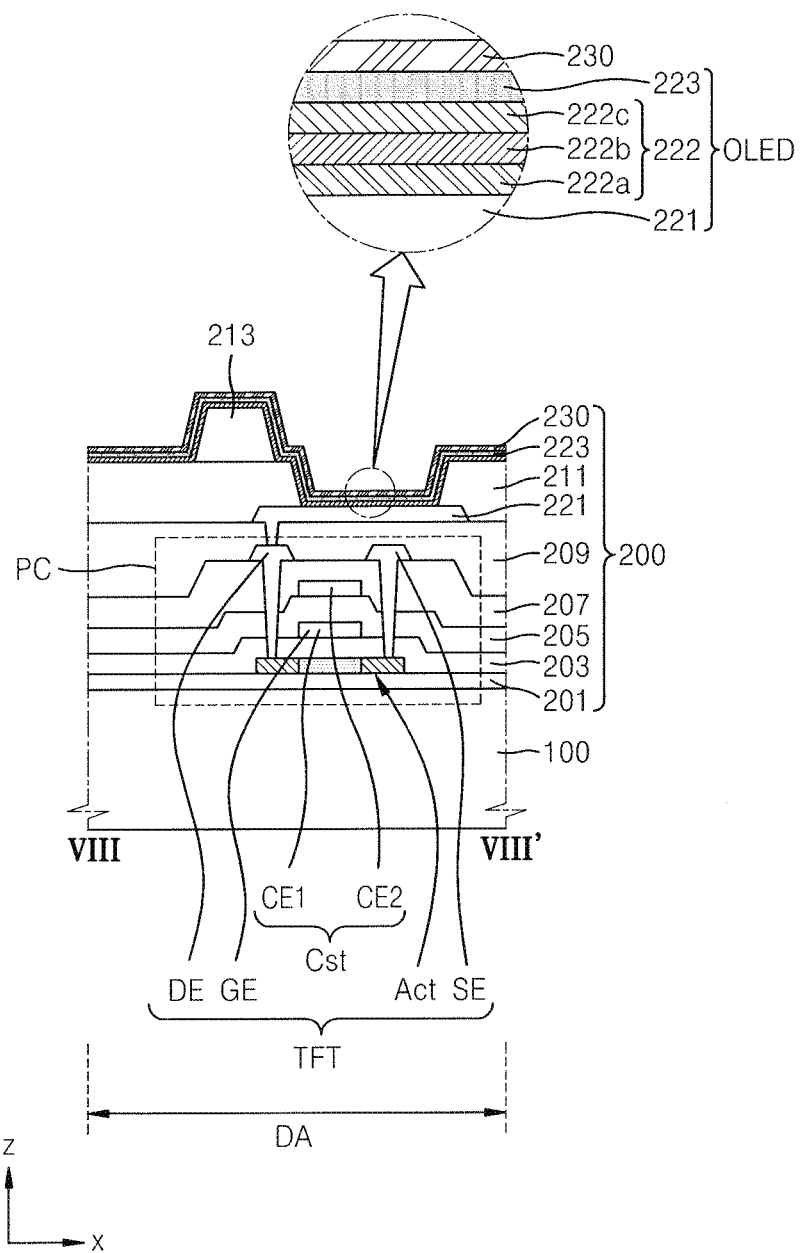
FIG. 8 illustrates a cross-sectional view of one pixel according to an example embodiment.

FIG. 8 is a cross-sectional view of one pixel according to an example embodiment, taken along a line VIII-VIII' of FIG. 7.

Referring to FIG. 8, the pixel circuit PC may be arranged on the substrate 100, and the organic light-emitting diode OLED electrically connected to the pixel circuit PC may be arranged on the pixel circuit PC. As described above with reference to FIGS. 3A through 3C and FIG. 4, the substrate 100 may include, for example, a glass material or polymer resin and may be a single layer or a multilayer.

A buffer layer 201 may be formed on the substrate 100 to prevent impurities from penetrating to a semiconductor layer Act of a thin-film transistor TFT. The buffer layer 201 may include an inorganic insulating material, such as silicon nitride or silicon oxide, and may be a single layer or multilayer including the above inorganic insulating material.

The pixel circuit PC may be arranged on the buffer layer 201. The pixel circuit PC may include the thin-film transistor TFT and the storage capacitor Cst. The thin-film transistor TFT may include the semiconductor layer Act, a gate electrode GE, a source electrode SE, and a drain electrode DE. The thin-film transistor TFT shown in FIG. 8 may correspond to the driving thin-film transistor described with reference to FIG. 6. In the present example embodiment, a top-gate type in which the gate electrode GE is arranged on the semiconductor layer Act with a gate insulating layer 203 therebetween is illustrated, but according to another example embodiment, the thin-film transistor TFT may be a bottom-gate type.

The semiconductor layer Act may include polysilicon. In another implementation, the semiconductor layer Act may include amorphous silicon, an oxide semiconductor, or an organic semiconductor. The gate electrode GE may include a low-resistance metal material. The gate electrode GE may include, for example, a conductive material including molybdenum (Mo), aluminum (Al), copper (Cu), or titanium (Ti), and may be a single layer or a multilayer including such a material.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, or hafnium oxide. The gate insulating layer 203 may be a single layer or a multilayer including such a material.

The source electrode SE and the drain electrode DE may include a material having good conductivity. The source electrode SE and the drain electrode DE may each include, for example, a conductive material including Mo, Al, Cu, or Ti, and may be a single layer or a multilayer including such a material. According to an example embodiment, the source electrode SE and the drain electrode DE may be a multilayer of Ti/Al/Ti.

The storage capacitor Cst may include a lower electrode CE1 and an upper electrode CE2 overlapping with a first interlayer insulating layer 205 therebetween. The storage capacitor Cst may overlap the thin-film transistor TFT. In this regard, FIG. 8 illustrates that the gate electrode GE of the thin-film transistor TFT is the lower electrode CE1 of the storage capacitor Cst. In another example embodiment, the storage capacitor Cst and the thin-film transistor TFT may not overlap each other. The storage capacitor Cst may be covered with a second interlayer insulating layer 207.

The first and second interlayer insulating layers 205 and 207 may include an inorganic insulating material, such as silicon oxide, silicon nitride, silicon oxynitride, aluminum oxide, titanium oxide, tantalum oxide, or hafnium oxide. The first and second interlayer insulating layers 205 and 207 may be a single layer or a multilayer including such a material.

The pixel circuit PC including the thin-film transistor TFT and the storage capacitor Cst may be covered by an insulating layer (planarization insulating layer) 209. The planarization insulating layer 209 may include a surface whose top surface is approximately flat. The planarization insulating layer 209 may include an organic insulating material, such as a general-purpose polymer, a polymer derivative having a phenol-group, an acryl-based polymer, an imide-based polymer, an arylether-based polymer, an amide-based polymer, a fluorine-based polymer, a p-xylene-based polymer, a vinyl alcohol-based polymer, or a blend thereof. According to an example embodiment, the planarization insulating layer 209 may include polyimide. The planarization insulating layer 209 may include an inorganic insulating material or may include inorganic and organic insulating materials.

A pixel electrode 221 may be provided on the planarization insulating layer 209. The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another example embodiment, the pixel electrode 221 may include a reflective film including silver (Ag), magnesium (Mg), Al, platinum (Pt), palladium (Pd), gold (Au), nickel (Ni), neodymium (Nd), iridium (Ir), chromium (Cr), or a compound thereof. In another example embodiment, the pixel electrode 221 may further include a film including ITO, IZO, ZnO, or $In_2O_3$ on and/or below the reflective film.

An insulating layer may be provided on the pixel electrode 221 as a pixel-defining layer 211. The pixel-defining layer 211 may include an opening exposing a top surface of the pixel electrode 221 while covering an edge of the pixel electrode 221. The pixel-defining layer 211 may include an organic insulating material. In another implementation, the pixel-defining layer 211 may include an inorganic insulating layer such as silicon nitride, silicon oxynitride, or silicon oxide. In another implementation, the pixel-defining layer 211 may include an organic insulating material and an inorganic insulating material.

An intermediate layer 222 may include a first functional layer 222a arranged below an emission layer 222b and/or a second functional layer 222c arranged on the emission layer 222b. The emission layer 222b may include a high-molecular or low-molecular weight organic material emitting light of a certain color.

The first functional layer 222a may be a single layer or a multilayer. For example, when the first functional layer 222a includes a high-molecular weight material, the first functional layer 222a may include a hole transport layer (HTL) having a single layer structure and may include poly-(3,4)-ethylene-dihydroxy thiophene (PEDOT) or polyaniline (PANI). When the first functional layer 222a includes a low-molecular weight material, the first functional layer 222a may include a hole injection layer (HIL) and an HTL.

When the first functional layer 222a and the emission layer 222b include a high-molecular weight material, the second functional layer 222c may be provided. The second functional layer 222c may be a single layer or a multilayer. The second functional layer 222c may include an electron transport layer (ETL) and/or an electron injection layer (EIL).

The emission layer 222b of the intermediate layer 222 may be provided for each pixel in the display area DA. The emission layer 222b may contact a top surface of the pixel electrode 221, which is exposed through an opening of the pixel-defining layer 211. Each of the first and second functional layers 222a and 222c of the intermediate layer 222 may be a single body, and may extends toward the first non-display area NDA1 (FIG. 5) to be located in the first non-display area NDA1 and the display area DA.

An opposite electrode 223 may include a conductive material having a low work function. For example, the opposite electrode 223 may include a (semi-)transparent layer including Ag, Mg, Al, Pt, Pd, Au, Ni, Nd, Ir, Cr, Li, calcium (Ca), or an alloy thereof. In another implementation, the opposite electrode 223 may further include a layer including ITO, IZO, ZnO, or $In_2O_3$ on the (semi-)transparent layer including the above material. The opposite electrode 223 may be provided not only on the display area DA but also on the first non-display area NDA1, as a single body. The intermediate layer 222 and the opposite electrode 223 may be provided via, for example, a thermal deposition method.

A spacer 213 may be provided on the pixel-defining layer 211. The spacer 213 may include, for example, an organic insulating material such as polyimide. In another implementation, the spacer 213 may include an inorganic insulating material such as silicon nitride or silicon oxide, or may include an organic insulating material and an inorganic insulating material.

The spacer 213 may include a material different from the pixel-defining layer 211. In another implementation, the spacer 213 may include the same material as the pixel-defining layer 211, and in this case, the pixel-defining layer 211 and the spacer 213 may be formed together, for example, via a mask process using a halftone mask. According to an example embodiment, the pixel-defining layer 211 and the spacer 213 may include polyimide.

A capping layer 230 may be arranged on the opposite electrode 223. The capping layer 230 may include, for example, LiF, an inorganic material, and/or an organic material.

Figure 9:
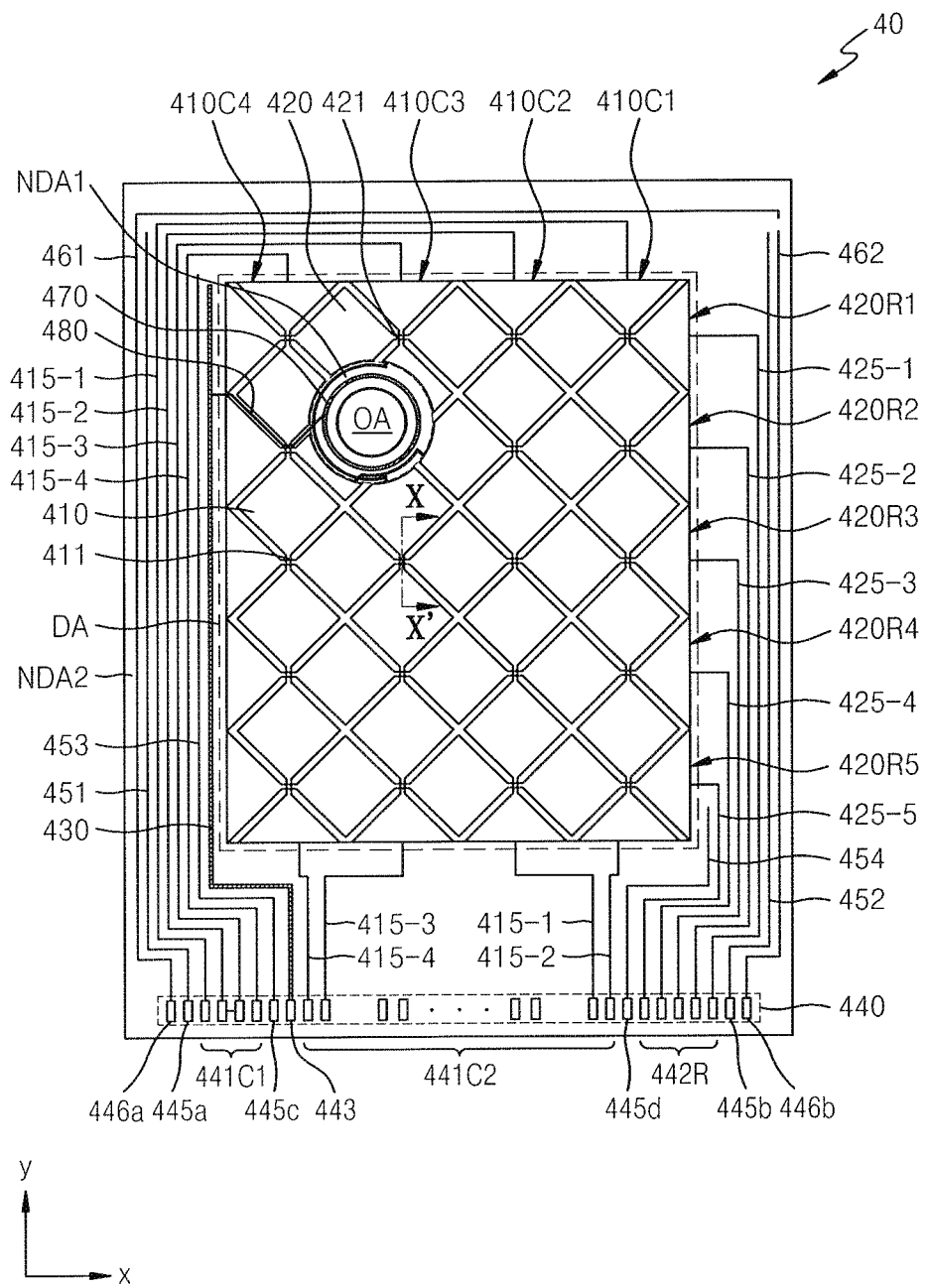
FIG. 9 illustrates a plan view of an input detecting layer on a display panel, according to an example embodiment.

FIG. 9 is a plan view of the input detecting layer 40 on a display panel, according to an example embodiment.

Referring to FIG. 9, the input detecting layer 40 may include first detecting electrodes 410, first trace lines 415-1 through 415-4 connected to the first detecting electrodes 410, second detecting electrodes 420, and second trace lines 425-1 through 425-5 connected to the second detecting electrodes 420.

The first detecting electrodes 410 may be arranged in a y-direction and the second detecting electrodes 420 may be arranged in an x-direction crossing the y-direction. The first detecting electrodes 410 arranged in the y-direction may be connected to each other via a first connecting electrode 411 therebetween, and may form first detecting lines 410C1 through 410C4. The second detecting electrodes 420 arranged in the x-direction may be connected to each other via a second connecting electrode 421 therebetween, and may form second detecting lines 420R1 through 420R5. The first detecting lines 410C1 through 410C4 and the second detecting lines 420R1 through 420R5 may cross each other. For example, the first detecting lines 410C1 through 410C4 may be perpendicular to the second detecting lines 420R1 through 420R5.

The first detecting lines 410C1 through 410C4 may be connected to a pad of a detecting signal pad unit 440 through the first trace lines 415-1 through 415-4 provided in the second non-display area NDA2. For example, the first trace lines 415-1 through 415-4 may have a double routing structure connected to top and bottom respectively of the first detecting lines 410C1 through 410C4. The first trace lines 415-1 through 415-4 connected to the top and bottom respectively of the first detecting lines 410C1 through 410C4 may be connected to corresponding first pads 441C1 and 441C2.

The second detecting lines 420R1 through 420R5 may be connected to a pad of the detecting signal pad unit 440 through the second trace lines 425-1 through 425-5 provided in the second non-display area NDA2. For example, the second trace lines 425-1 through 425-5 may be connected to corresponding second pads 442R.

A ground line may be arranged in the second non-display area NDA2, which may help to prevent external electrostatic discharge (ESD) introduced to the input detecting layer 40, for example, ESD introduced through the second non-display area NDA2. For example, FIG. 9 illustrates a first ground line 461 extending along a left side and a top side of the second non-display area NDA2 and a second ground line 462 extending along a right side of the second non-display area NDA2. The first and second ground lines 461 and 462 may be spaced apart from each other by a certain distance. In this regard, FIG. 9 illustrates the first and second ground lines 461 and 462 spaced apart from each other in a region adjacent to an upper right side of the display area DA in the second non-display area NDA2. The first and second ground lines 461 and 462 may be respectively connected to pads 446a and 446b. The first and second ground lines 461 and 462 may each have a voltage level of a constant value (for example, a constant zero voltage, a constant negative direct current (DC) voltage, or a constant positive DC voltage). The first and second ground lines 461 and 462 may have a constant voltage of different levels from each other or of the same level.

A guard line may be arranged around a group of the first trace lines 415-1 through 415-4 and a group of the second trace lines 425-1 through 425-5, which may help to prevent interference between adjacent lines or wires. For example, as shown in FIG. 9, a first guard line 451 may be located between the first ground line 461 and an upper group of the first trace lines 415-1 through 415-4 which are respectively connected to the upper side of the first detecting lines 410C1 through 410C4. A second guard line 452 may be located between the second ground line 462 and the group of second trace lines 425-1 through 425-5. A third guard line 453 may be located between the upper group of first trace lines 415-1 through 415-4 and a lower group of first trace lines 415-1 through 415-4 which are respectively connected to the lower side of the first detecting lines 410C1 through 410C4, and a fourth guard line 454 may be located between the lower group of first trace lines 415-1 through 415-4 and the group of second trace lines 425-1 through 425-5. The first through fourth guard lines 451 through 454 may be respectively connected to pads 445a through 445d. The first through fourth guard lines 451 through 454 may each have a voltage level of a constant voltage. For example, the first through fourth guard lines 451 through 454 may have a constant voltage of respectively different levels from each other, or of the same level.

A first line 470 may be arranged in the first non-display area NDA1, which may help to prevent damage by external ESD introduced to the input detecting layer 40, for example, ESD introduced through surroundings of the opening area OA. The first line 470 may have a ring shape surrounding the opening area OA as shown in FIG. 9. According to another example embodiment, the first line 470 may have a shape partially surrounding the opening area OA (for example, at least 90%). According to an example embodiment, the first line 470 may have a continuous, completely surrounding ring shape.

The first line 470 may have a voltage level of a constant voltage. According to an example embodiment, the first line 470 may be electrically connected to a third ground line 430 arranged in the second non-display area NDA2 via a connecting line 480 passing the display area DA.

The third ground line 430 may be located between, for example, the display area DA and the upper group of first trace lines 415-1 through 415-4. The third ground line 430 may be connected to a pad 443 included in the detecting signal pad unit 440. The first line 470 of the first non-display area NDA1, the third ground line 430 of the second non-display area NDA2, and the connecting line 480 connecting thereto may have the same voltage level (constant voltage).

FIG. 9 illustrates a double routing structure in which the first trace lines 415-1 through 415-4 are connected to the upper and lower respectively of the first detecting lines 410C1 through 410C4. In another example embodiment, the first trace lines 415-1 through 415-4 may be connected to only the upper or lower of the first detecting lines 410C1 through 410C4.

Figure 10:
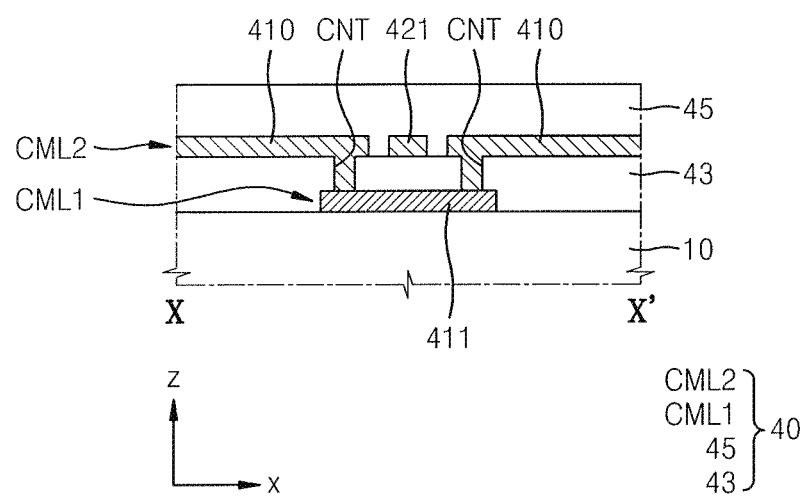
FIG. 10 illustrates a cross-sectional view of an input detecting layer according to an example embodiment.

FIG. 10 is a cross-sectional view of the input detecting layer 40 according to an example embodiment, and corresponds to a cross-sectional view taken along a line X-X' of FIG. 9.

Referring to FIG. 10, the input detecting layer 40 may include a first conductive layer CML1 and a second conductive layer CML2, which are arranged on the display panel 10. A first insulating layer 43 may be provided between the first conductive layer CML1 and the second conductive layer CML2, and a second insulating layer 45 may be provided on the second conductive layer CML2.

The first and second conductive layers CML1 and CML2 may include, for example, a metal layer or a transparent conductive layer. The metal layer may include Mo, Ag, Ti, Cu, Al, or an alloy thereof. The transparent conductive layer may include a transparent conductive oxide, such as ITO, IZO, ZnO, or ITZO. In addition, the transparent conductive layer may include a conductive polymer such as PEDOT, a metal nanowire, or graphene.

The first and second conductive layers CML1 and CML2 may include a single layer or a multilayer. The first and second conductive layers CML1 and CML2 of a single layer may include a metal layer or a transparent conductive layer, and the metal layer and the transparent conductive layer may be as described above. The first and second conductive layers CML1 and CML2 of a multilayer may include a metal layer of multilayer. The metal layer of multilayer may include, for example, 3-layers of Ti/Al/Ti. In another implementation, the metal layer of multilayer may include a metal layer and a transparent conductive layer. The first and second conductive layers CML1 and CML2 may have different or same stacked structures. For example, the first conductive layer CML1 may include a metal layer and the second conductive layer CML2 may include a transparent conductive layer. In another implementation, the first and second conductive layers CML1 and CML2 may include the same metal layer of multilayer.

The first and second insulating layers 43 and 45 may include an inorganic material, such as silicon oxide, silicon nitride, or silicon oxynitride. In another implementation, the first and second insulating layers 43 and 45 may include an organic material.

Some of the first and second detecting electrodes 410 and 420 and first and second connecting electrodes 411 and 421 described above with reference to FIG. 9 may be located on the first conductive layer CML1 and the remaining thereof may be located on the second conductive layer CML2. For example, as shown in FIG. 10, the first conductive layer CML1 may include the first connecting electrode 411 and the second conductive layer CML2 may include the first and second detecting electrodes 410 and 420 (see FIGS. 9 and 10) and the second connecting electrode 421. The neighboring second detecting electrodes 420 may be electrically connected through the second connecting electrode 421 located on the same layer. The neighboring first detecting electrodes 410 may be electrically connected through the first connecting electrode 411 while being connected to the first connecting electrode 411 through a contact hole CNT penetrating the first insulating layer 43.

In the example embodiment illustrated in FIG. 10, the input detecting layer 40 includes the first conductive layer CML1, the first insulating layer 43, and the second conductive layer CML2. According to another example embodiment, an insulating layer including an inorganic material or an organic material may be further arranged below the first conductive layer CML1.

A stacked structure and materials of the first and second conductive layer CML1 and CML2, for example, a stacked structure and materials of the first and second detecting electrodes 410 and 420 (see FIG. 9), may be used. RC delay may affect sensing. Detecting electrodes including a metal layer may have a lower resistance than a transparent conductive layer, such that an RC value may be decreased. Accordingly, a charging time of a capacitor defined between the detecting electrodes may be reduced. Detecting electrodes including a transparent conductive layer may not visible to a user compared to a metal layer and may have a high input area, thereby increasing capacitance.

Figure 11A:
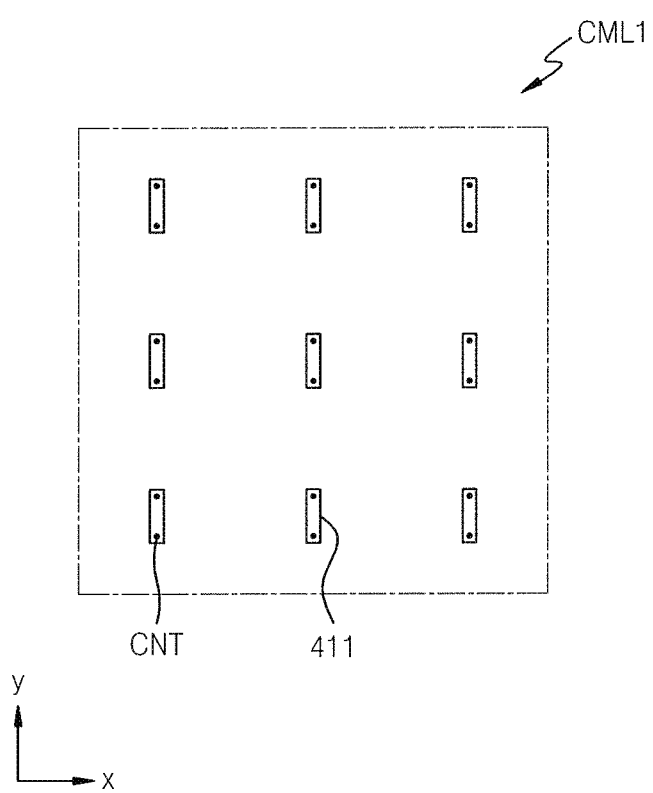
FIG. 11A illustrates a plan view of a first conductive layer in the input detecting layer, according to an example embodiment.
Figure 11B:
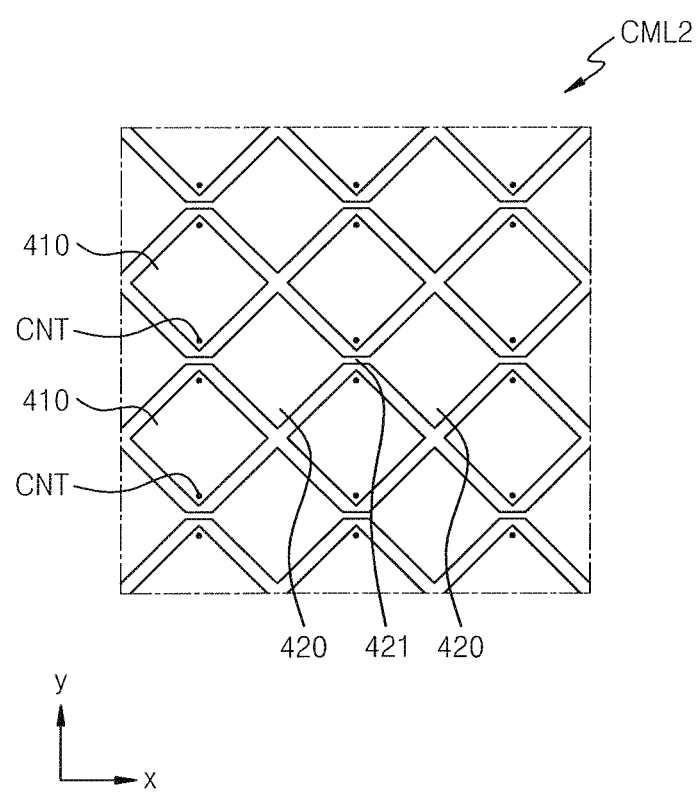
FIG. 11B illustrates a plan view of a second conductive layer in the input detecting layer, according to an example embodiment.

FIG. 11A is a plan view of the first conductive layer CML1 in the input detecting layer 40, according to an example embodiment, and FIG. 11B is a plan view of the second conductive layer CML2 in the input detecting layer 40, according to an example embodiment.

Referring to FIGS. 10, 11A, and 11B, the first conductive layer CML1 may include the first connecting electrodes 411, and the second conductive layer CML2 may include the first detecting electrodes 410, the second detecting electrodes 420, and the second connecting electrodes 421.

The second detecting electrodes 420 may be connected to each other by the second connecting electrodes 421 provided on the same layer as the second detecting electrodes 420. The first connecting electrode 411 electrically connecting the neighboring first detecting electrodes 410 may be connected to the neighboring first detecting electrodes 410 through the contact hole CNT provided in the first insulating layer 43.

When the first and second detecting electrodes 410 and 420 include a transparent conductive layer, the first and second detecting electrodes 410 and 420 may have a rectangular or diamond shape as shown in FIG. 11B and may have an area corresponding to the above shape, and thus may have a relatively large input area compared to a mesh-type detecting electrode described below and have high capacitance.

Figure 12A:
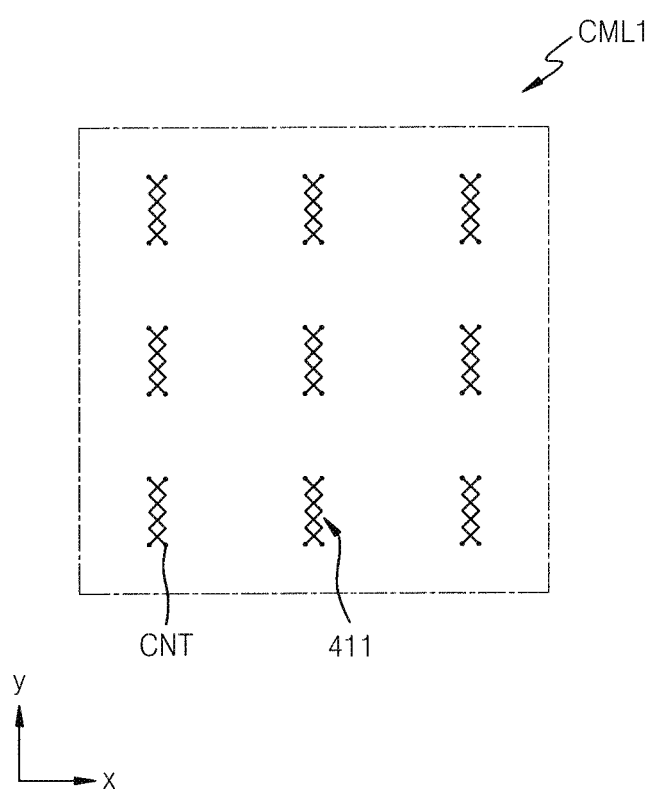
FIG. 12A illustrates a plan view of the first conductive layer in the input detecting layer, according to another example embodiment.
Figure 12B:
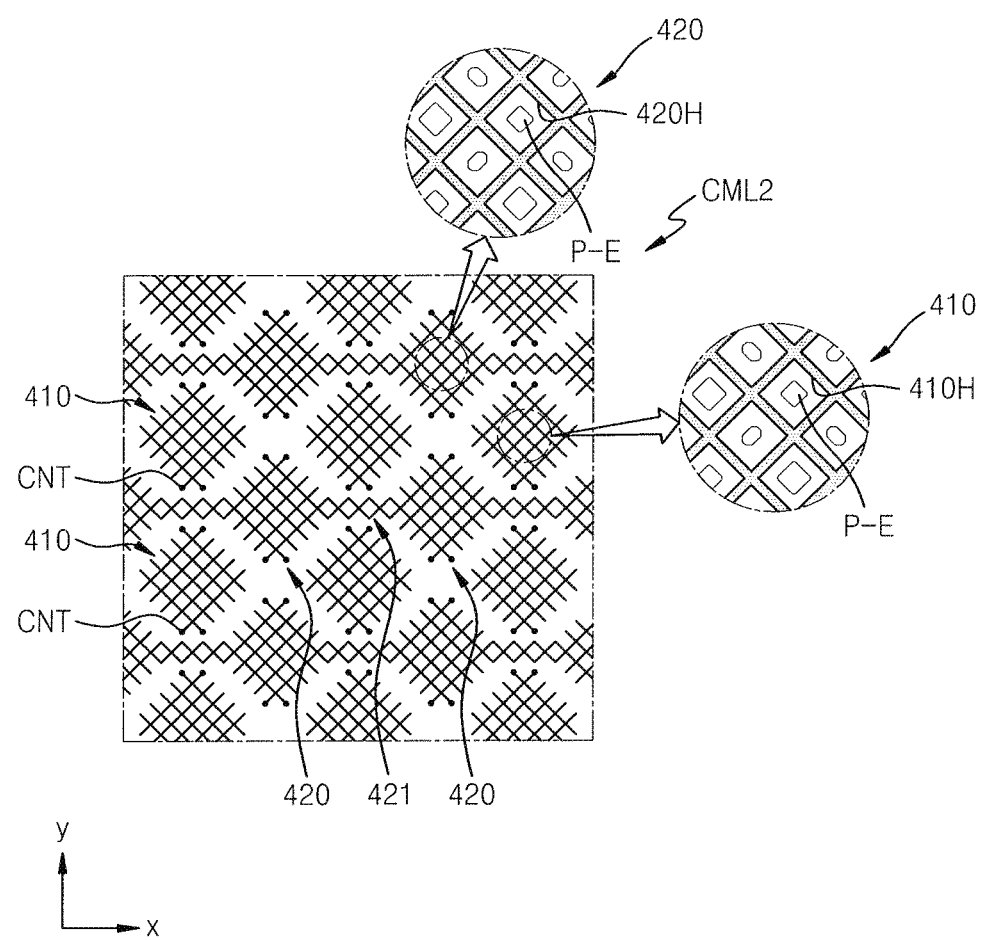
FIG. 12B illustrates a plan view of the second conductive layer in the input detecting layer, according to another example embodiment.

FIG. 12A is a plan view of the first conductive layer CML1 in the input detecting layer 40, according to another example embodiment, and FIG. 12B is a plan view of the second conductive layer CML2 in the input detecting layer 40, according to another example embodiment.

Referring to FIGS. 10, 12A, and 12B, the first and second detecting electrodes 410 and 420 and the first and second connecting electrodes 411 and 421 may have a mesh (or grid or lattice) shape. When the first and second detecting electrodes 410 and 420 include a metal layer, the first and second detecting electrodes 410 and 420 may have a mesh shape as shown in FIGS. 12A and 12B, which may reduce visibility to a user.

The first and second connecting electrodes 411 and 421 may respectively include holes 410H and 420H between metal layers of a mesh shape. The holes 410H and 420H may be provided to overlap an emission area P-E of a pixel of the display panel 10 of FIG. 10.

The second detecting electrodes 420 may be connected to each other by the second connecting electrodes 421 provided on the same layer as the second detecting electrodes 420. The first detecting electrodes 410 may be connected to each other by the first connecting electrodes 411 provided on a different layer from the first detecting electrodes 410.

Figure 13:
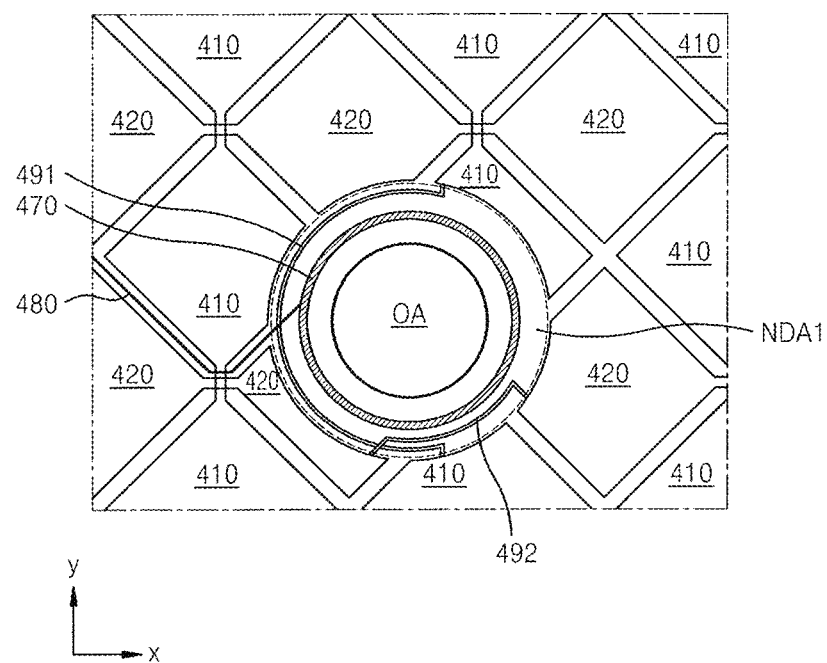
FIG. 13 illustrates a partial plan view of the surroundings of an opening area as the input detecting layer, according to an example embodiment.

FIG. 13 is a partial plan view of surroundings of the opening area OA as the input detecting layer 40, according to an example embodiment.

In the example embodiment illustrated in FIG. 13, the first line 470 described above with reference to FIG. 9 is located around the opening area OA, for example, in the first non-display area NDA1. First and second connecting electrode sectors 491 and 492 may be arranged around the first line 470.

Some of the first and second detecting electrodes 410 and 420 may be spaced apart from each other with respect to the opening area OA. For example, as shown in FIG. 13, the first detecting electrodes 410 arranged at the upper right and lower right of the opening area OA may be spaced apart from each other and electrically connected to each other by the first connecting electrode sector 491. Similarly, the second detecting electrodes 420 arranged at the lower left and lower right of the opening area OA may be spaced apart from each other and electrically connected to each other by the second connecting electrode sector 492.

FIG. 13 illustrates two connecting electrode sectors as an example. The number of connecting electrode sectors may be varied, for example, based on the number and types of detecting electrodes spaced apart from each other among the first and second detecting electrodes 410 and 420 around the opening area OA according to the size and location of the opening area OA. The first and second connecting electrode sectors 491 and 492 may be located on the first conductive layer CML1 described above with reference to FIG. 10. In another implementation, the first and second connecting electrode sectors 491 and 492 may be located on the second conductive layer CML2 (see FIG. 10). In another implementation, some of the first and second connecting electrode sectors 491 and 492 may be located on the first conductive layer CML1 and the other may be located on the second conductive layer CML1 while including a region connected to a region of the first conductive layer CML1 described above.

Figure 14:
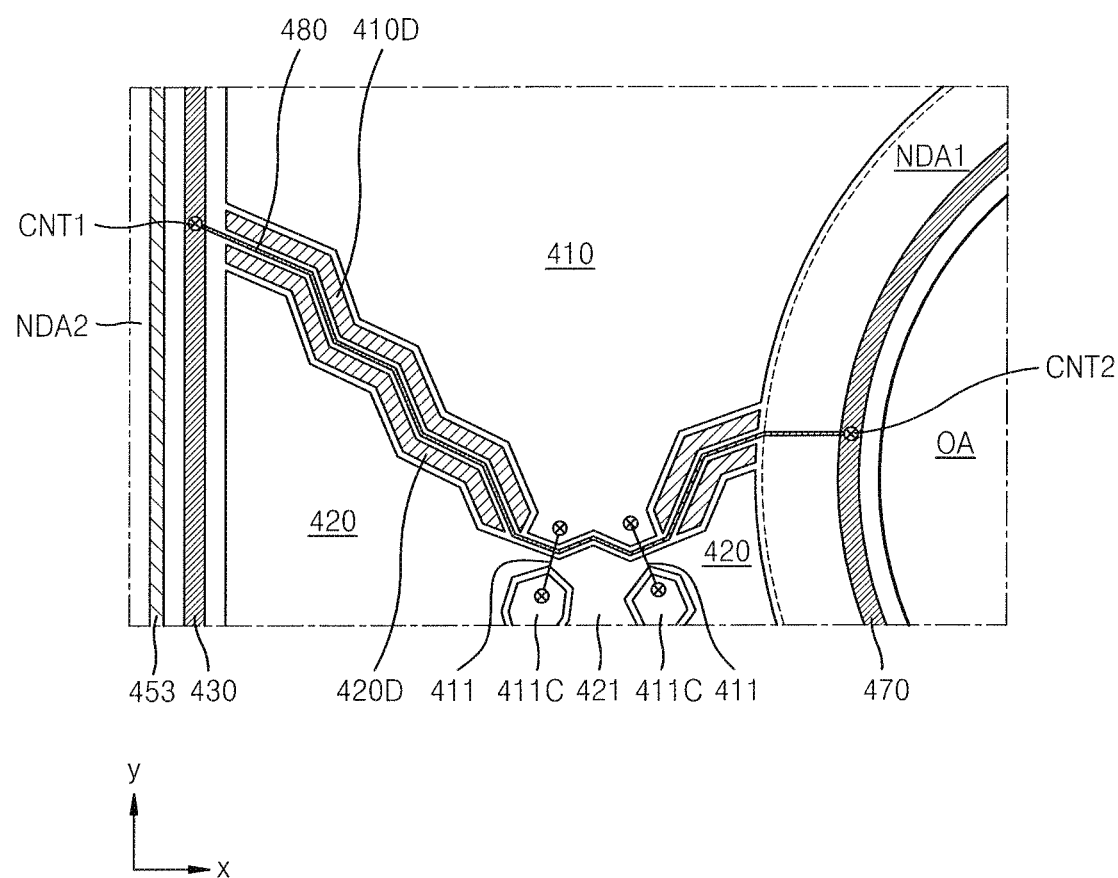
FIG. 14 illustrates a plan view of a structure around a first line in the input detecting layer, according to an example embodiment.
Figure 15A:
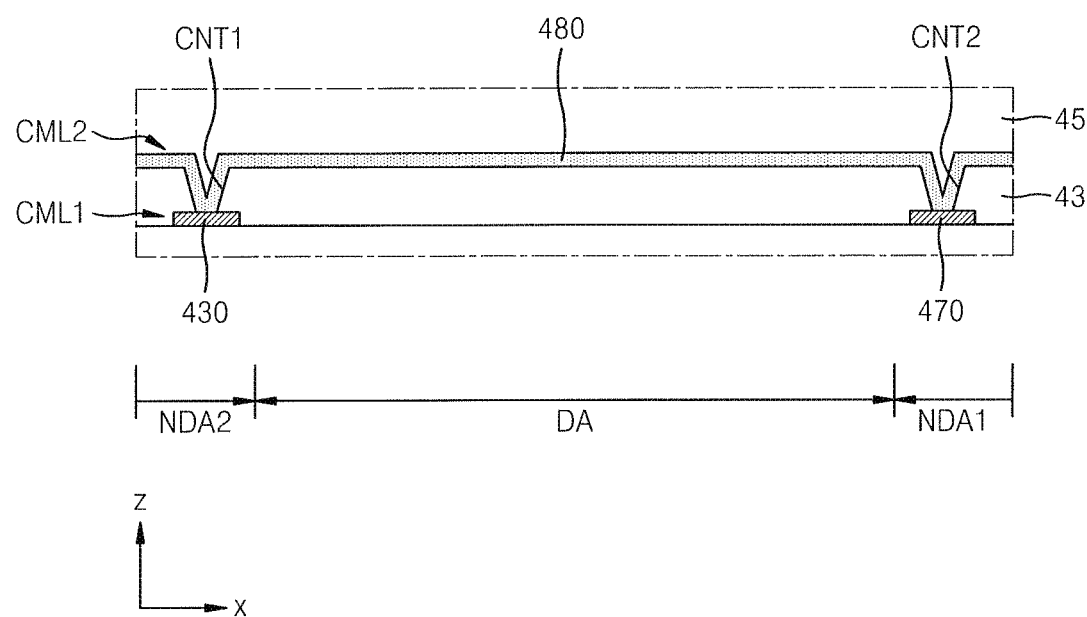
FIG. 15A illustrates a cross-sectional view taken along an extending direction of a connecting line of FIG. 14.
Figure 15B:
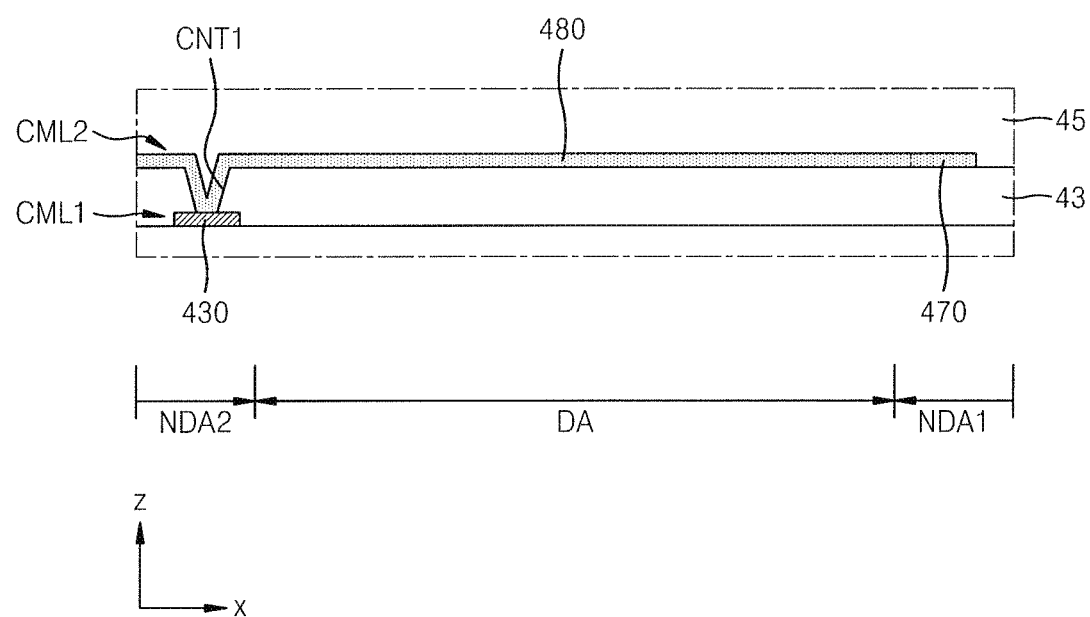
FIGS. 15B and 15C illustrate modified embodiments of FIG. 15A.
Figure 15C:
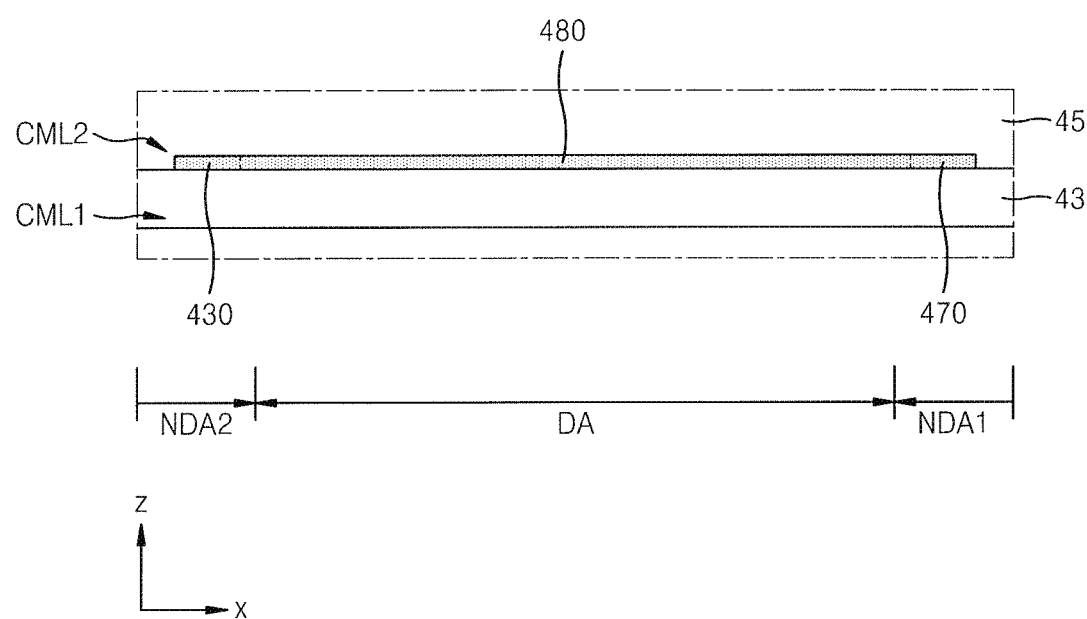

FIG. 14 is a plan view of a structure around the first line 470 in the input detecting layer 40, according to an example embodiment, FIG. 15A is a cross-sectional view taken along an extending direction of the connecting line 480 of FIG. 14, and FIGS. 15B and 15C are modified embodiments of FIG. 15A. For convenience, in FIG. 14, a connecting electrode sector described above with reference to FIG. 13 is omitted.

Referring to FIGS. 14 and 15A, the connecting line 480 (connecting the first line 470 located in the first non-display area NDA1 to the third ground line 430 located in the second non-display area NDA2) may pass between the first and second detecting electrodes 410 and 420. The connecting line 480 may be connected to the third ground line 430 and the first line 470 respectively through first and second contact holes CNT1 and CNT2.

The first and second detecting electrodes 410 and 420 may be located on the same layer as described above with reference to FIGS. 10, 11B, and 12B, and may be spaced apart from each other. The second detecting electrodes 420 of the second conductive layer CML2 may be connected to the second connecting electrode 421 of the second conductive layer CML2, and the first detecting electrode 410 of the second conductive layer CML2 may be connected to the first connecting electrode 411 of the first conductive layer CML1. According to an example embodiment, as shown in FIG. 14, the first connecting electrode 411 (connecting the first detecting electrodes 410) may be connected to an intervening electrode 411C located in the second conductive layer CML2. As such, the neighboring first detecting electrodes 410 may each be connected to the intervening electrode 411C via the first connecting electrode 411, wherein the intervening electrode 411C may act as a connecting electrode. The intervening electrode 411C may be located on the same layer as the first detecting electrodes 410.

According to an example embodiment, first and second dummy electrodes 410D and 420D may be located between the first and second detecting electrodes 410 and 420. The first and second dummy electrodes 410D and 420D may be spaced apart from neighboring electrodes. The first and second dummy electrodes 410D and 420D may be in an electrically floating state. The first and second dummy electrodes 410D and 420D may help to prevent moire pattern or patterns of the first and second detecting electrodes 410 and 420 from being visible to a user by intervals between the first and second detecting electrodes 410 and 420. The intervals between the first and second detecting electrodes 410 and 420 may be sufficiently separated by the first and second dummy electrodes 410D and 420D. Thus, touch sensing may be improved. The first and second dummy electrodes 410D and 420D may be located on the same layer as the first and second detecting electrodes 410 and 420. For example, the second conductive layer CML2 may include the first and second detecting electrodes 410 and 420 and the first and second dummy electrodes 410D and 420D.

The connecting line 480 may be located in a gap between the first and second detecting electrodes 410 and 420 and/or a gap between the first and second dummy electrodes 410D and 420D. Referring to FIG. 15A, the first conductive layer CML1 may include the third ground line 430 and the first line 470, and the second conductive layer CML2 may include the connecting line 480. The connecting line 480 may be connected to the third ground line 430 and the first line 470 respectively through the first and second contact holes CNT1 and CNT2 provided in the first insulating layer 43 between the first and second conductive layers CML1 and CML2.

The first conductive layer CML1 may include a metal layer, and the metal layer may include Mo, Mb, Ag, Ti, Cu, Al, or an alloy thereof. The second conductive layer CML2 may include a transparent conductive layer of ITO, and the first and second detecting electrodes 410 and 420 including a transparent conductive layer may have a rectangular or diamond shape having a certain area as shown in FIGS. 14 and 11B.

According to another example embodiment, the first and second conductive layers CML1 and CML2 may include a metal layer, and the first and second detecting electrodes 410 and 420 including a metal layer may have a mesh shape as shown in FIG. 12B. When the first and second conductive layers CML1 and CML2 include a metal layer, one of the first line 470 and the third ground line 430 may be included in the first conductive layer CML1 and the other one may be included in the second conductive layer CML2. In this regard, FIG. 15B illustrates that the third ground line 430 is included in the first conductive layer CML1 and the first line 470 is included in the second conductive layer CML2. According to another example embodiment, the third ground line 430 may be included in the second conductive layer CML2 and the first line 470 may be included in the first conductive layer CML1. According to another example embodiment, the first line 470 and the third ground line 430 may be included in the second conductive layer CML2 as shown in FIG. 15C.

Figure 16:
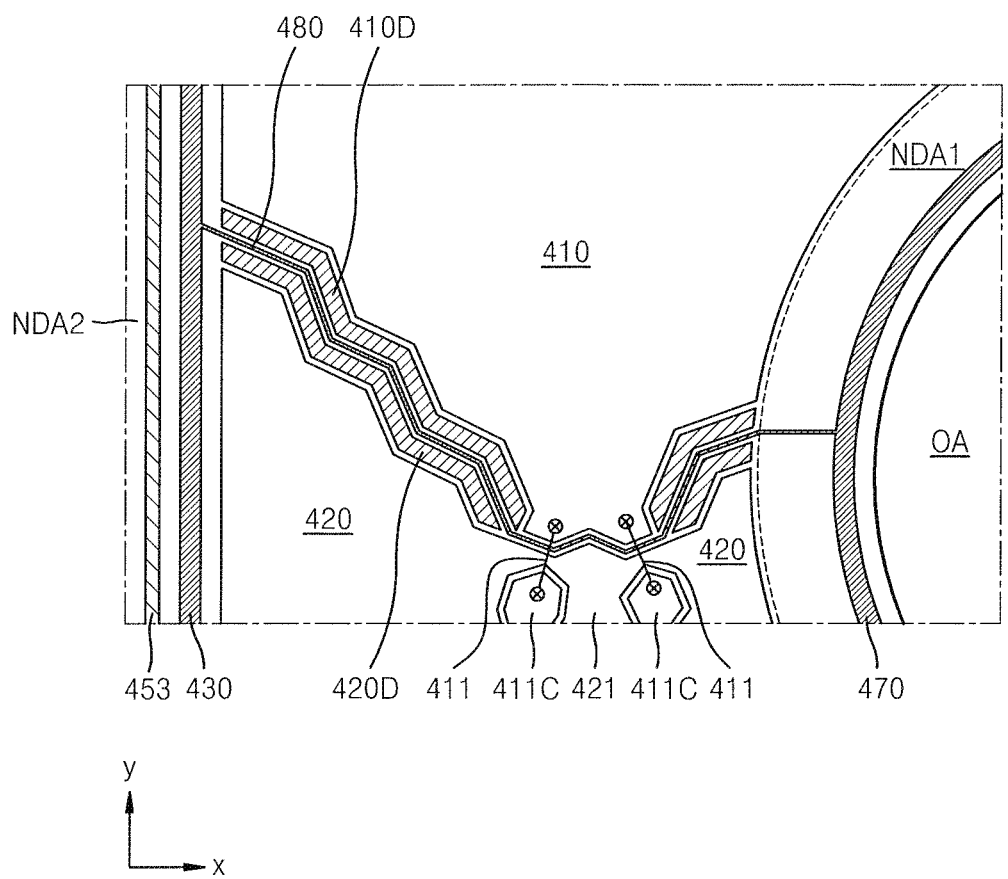
FIG. 16 illustrates a plan view of a structure around the first line in the input detecting layer, according to another example embodiment.
Figure 17:
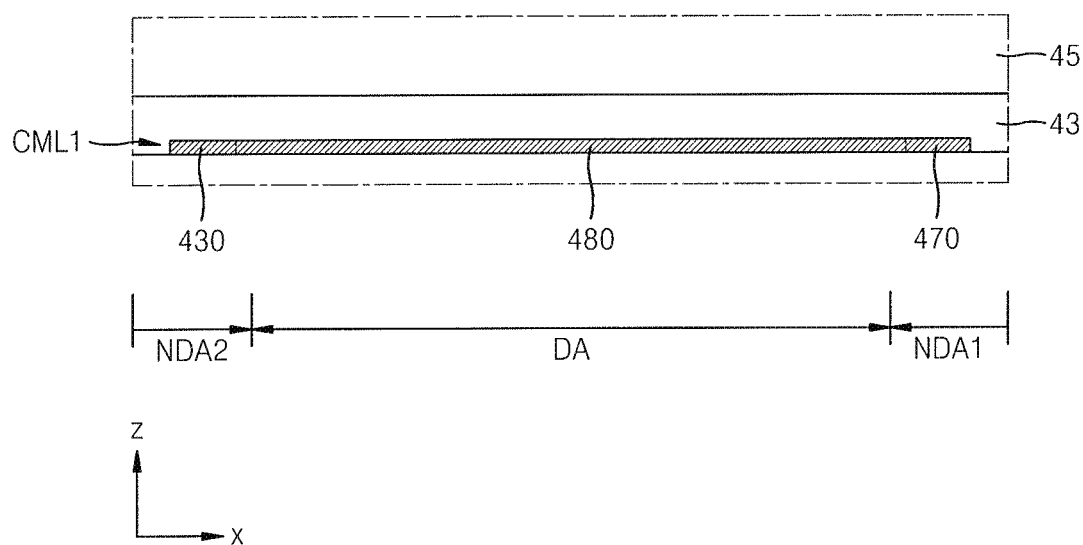
FIG. 17 illustrates a cross-sectional view taken along an extending direction of a connecting line of FIG. 16.

FIG. 16 is a plan view of a structure around the first line 470 in the input detecting layer 40, according to another example embodiment, and FIG. 17 is a cross-sectional view taken along an extending direction of the connecting line 480 of FIG. 16. For convenience, in FIG. 16, a connecting electrode sector described above with reference to FIG. 13 is omitted.

Referring to FIGS. 16 and 17, features are the same as those described above with reference to FIGS. 14 and 15C, except the connecting line 480 being located on the same layer as the third ground line 430 and the first line 470. Hereinafter, differences will be mainly described below.

The first conductive layer CML1 may include the third ground line 430, the first line 470, and the connecting line 480. The third ground line 430, the first line 470, and the connecting line 480 may be a single body, and accordingly, the first insulating layer 43 may not include a contact hole for connecting the third ground line 430 and the connecting line 480 and connecting the first line 470 and the connecting line 480.

Figure 18:
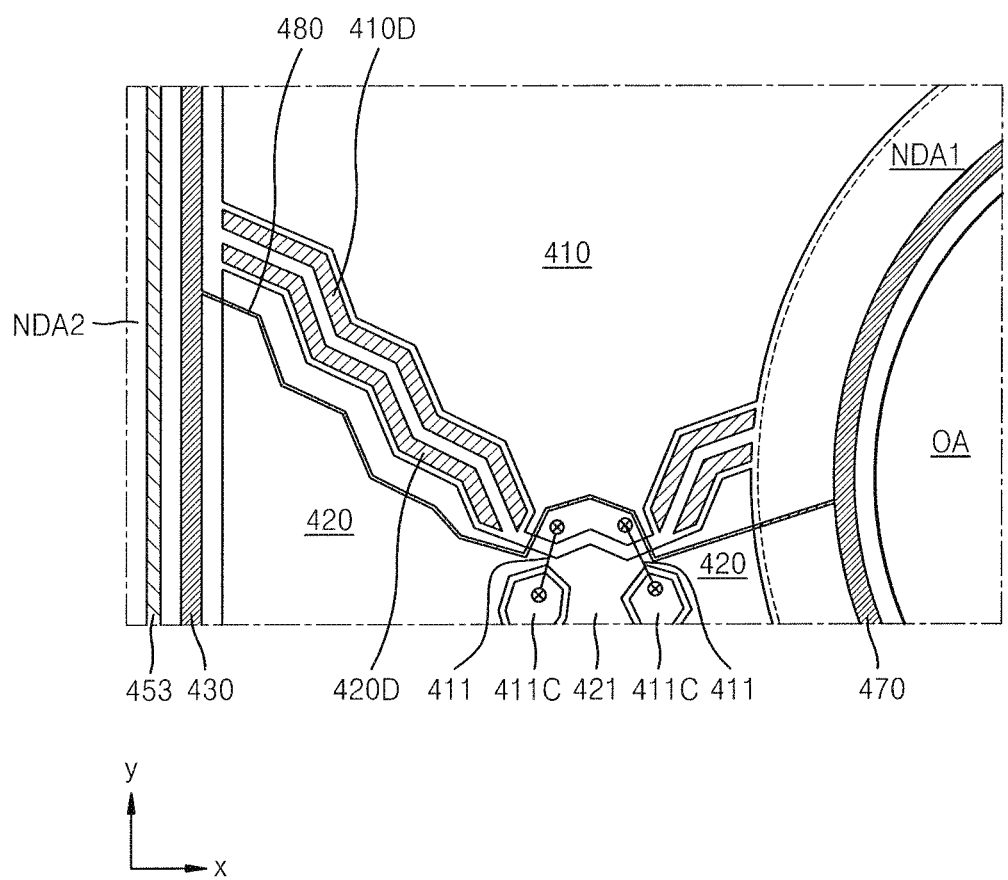
FIG. 18 illustrates a plan view of a structure around the first line in the input detecting layer, according to another example embodiment.
Figure 19:
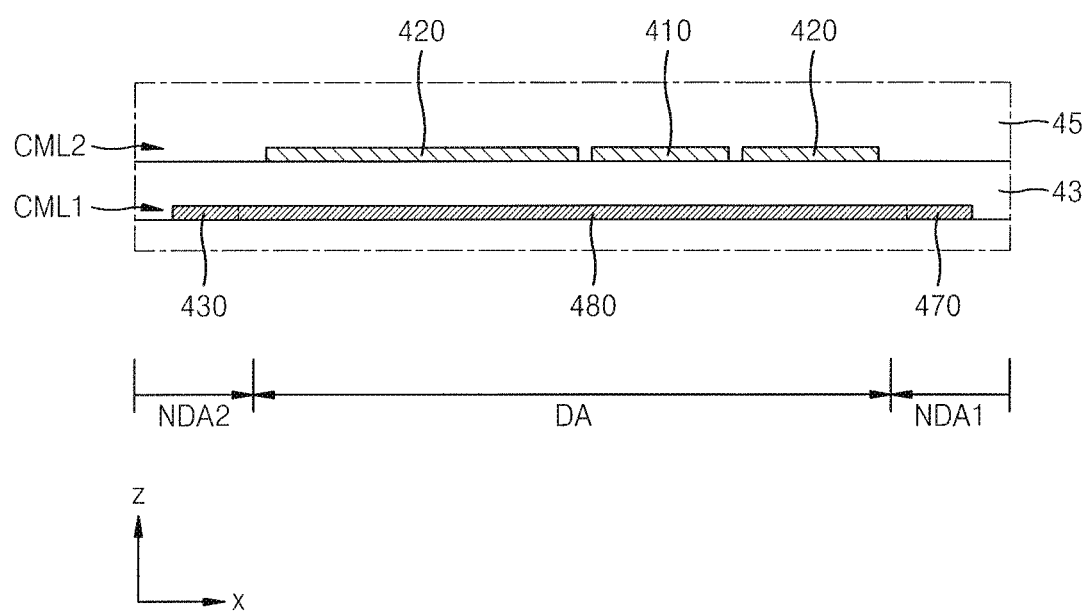
FIG. 19 illustrates a cross-sectional view taken along an extending direction of a connecting line of FIG. 18.

FIG. 18 is a plan view of a structure around the first line 470 in the input detecting layer 40, according to another example embodiment, and FIG. 19 is a cross-sectional view taken along an extending direction of the connecting line 480 of FIG. 18. For convenience, in FIG. 18, a connecting electrode sector described above with reference to FIG. 13 is omitted.

Referring to FIGS. 18 and 19, features are the same as those described above with reference to FIGS. 14 and 15C, except the connecting line 480 overlapping at least one of the first or second detecting electrodes 410 or 420. Differences will be mainly described below.

In the present example embodiment, the first conductive layer CML1 includes the third ground line 430, the first line 470, and the connecting line 480. The connecting line 480 may form a single body with the third ground line 430 and the first line 470. A first portion of the connecting line 480 passing the display area DA may overlap the second detecting electrode 420 arranged in the display area DA, and a second portion of the connecting line 480 may overlap the first detecting electrode 410 arranged in the display area DA.

The first conductive layer CML1 may include the first connecting electrode 411 and the connecting line 480. The second portion of the connecting line 480 may overlap the first detecting electrode 410 while detouring or bypassing around the first connecting electrode 411. According to another example embodiment, when the first connecting electrode 411 is included in a third conductive layer that is different from the first conductive layer CML1, the connecting line 480 may overlap the first connecting electrode 411, and a portion of the connecting line 480 passing the display area DA may overlap only one of the first detecting electrode 410 and the second detecting electrode 420.

Figure 20:
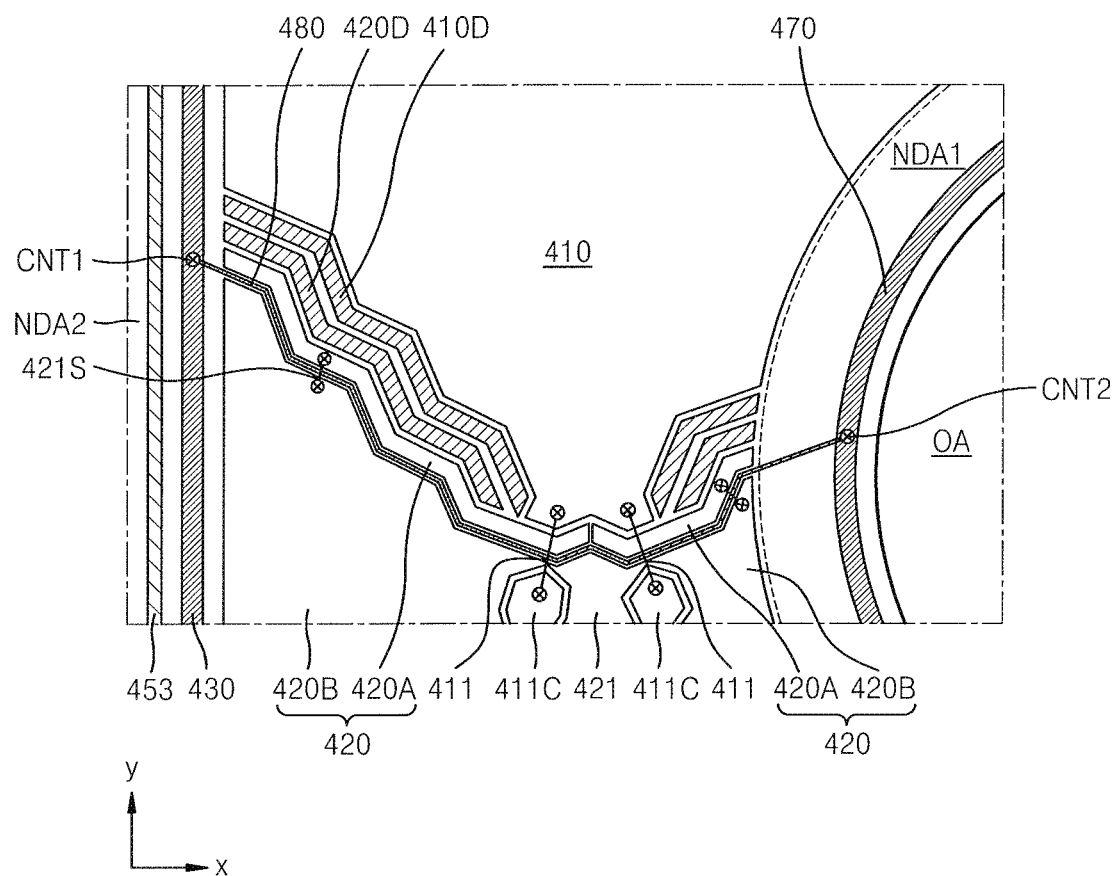
FIG. 20 illustrates a plan view of a structure around the first line in the input detecting layer, according to another example embodiment.
Figure 21:
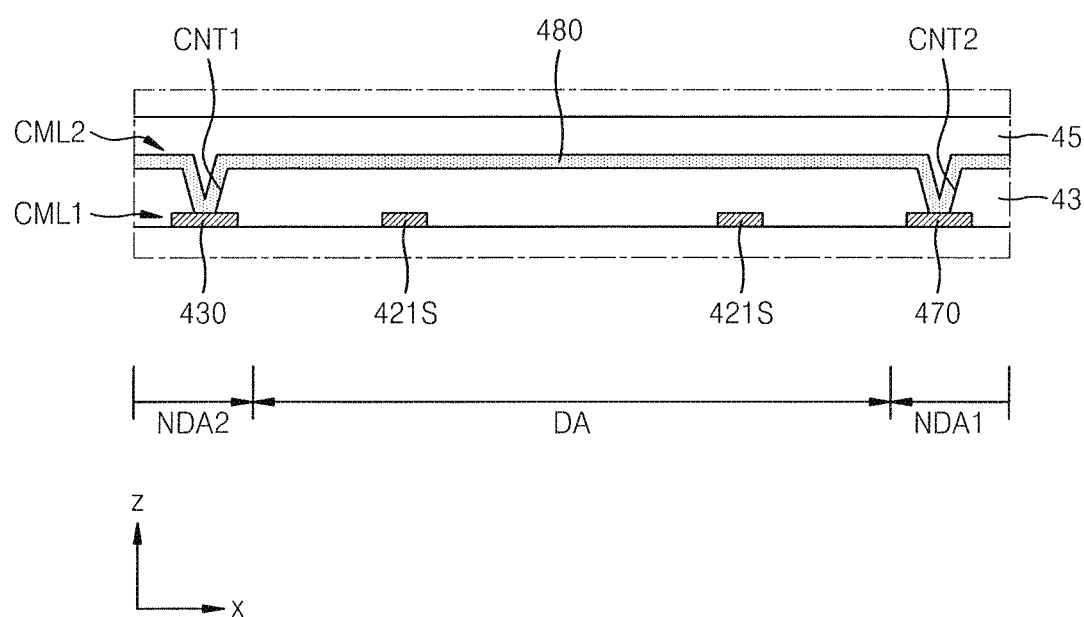
FIG. 21 illustrates a cross-sectional view taken along an extending direction of a connecting line of FIG. 20.

FIG. 20 is a plan view of a structure around the first line 470 in the input detecting layer 40, according to another example embodiment, and FIG. 21 is a cross-sectional view taken along an extending direction of the connecting line 480 of FIG. 20. For convenience, in FIG. 20, a connecting electrode sector described above with reference to FIG. 13 is omitted.

Referring to FIGS. 20 and 21, the connecting line 480 may be located between sub-electrodes of the second detecting electrode 420. For example, the second detecting electrode 420 may include a first sub-detecting electrode 420A and a second sub-detecting electrode 420B, and the connecting line 480 may be located between the first and second sub-detecting electrodes 420A and 420B.

The first conductive layer CML1 may include the third ground line 430, the first line 470, the first connecting electrode 411, and a sub-connecting electrode 421S. The second conductive layer CML2 may include the first detecting electrode 410, the intervening electrode 411C, the first and second sub-detecting electrodes 420A and 420B, the first and second dummy electrodes 410D and 420D, and the connecting line 480. The first and second sub-detecting electrodes 420A and 420B may be electrically connected to each other via the sub-connecting electrode 421S.

The connecting line 480 may be connected to the third ground line 430 and the first line 470 respectively through the first and second contact holes CNT1 and CNT2 of the first insulating layer 43, and a portion of the connecting line 480 may overlap the sub-connecting electrode 421S in the display area DA.

Figure 22:
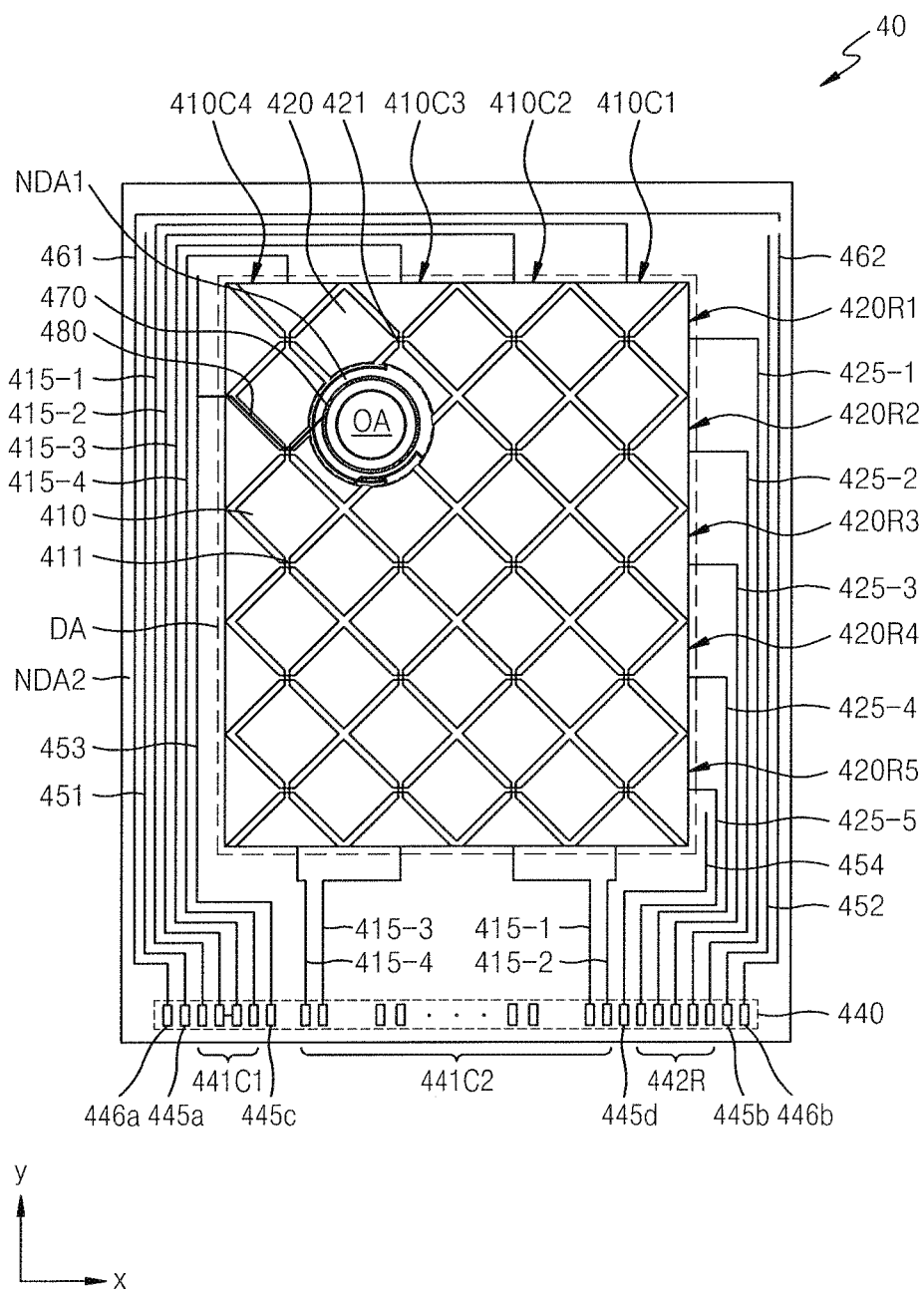
FIG. 22 illustrates a plan view of the input detecting layer on the display panel, according to another example embodiment.

FIG. 22 is a plan view of the input detecting layer 40 on the display panel 10, according to another example embodiment. The input detecting layer 40 of FIG. 22 has the same configuration as described above with reference to FIG. 9, except that the third ground line 430 and the corresponding pad 443 are omitted.

Referring to FIG. 22, the first line 470 arranged in the first non-display area NDA1 while surrounding the opening area OA is electrically connected to a second wire arranged in the second non-display area NDA2, for example, the third guard line 453. The first line 470 and the third guard line 453 may be electrically connected to each other via the connecting line 480. In the present example embodiment, the third guard line 453 has a voltage level of a constant voltage. The first line 470 may have the same voltage level as the third guard line 453.

Figure 23:
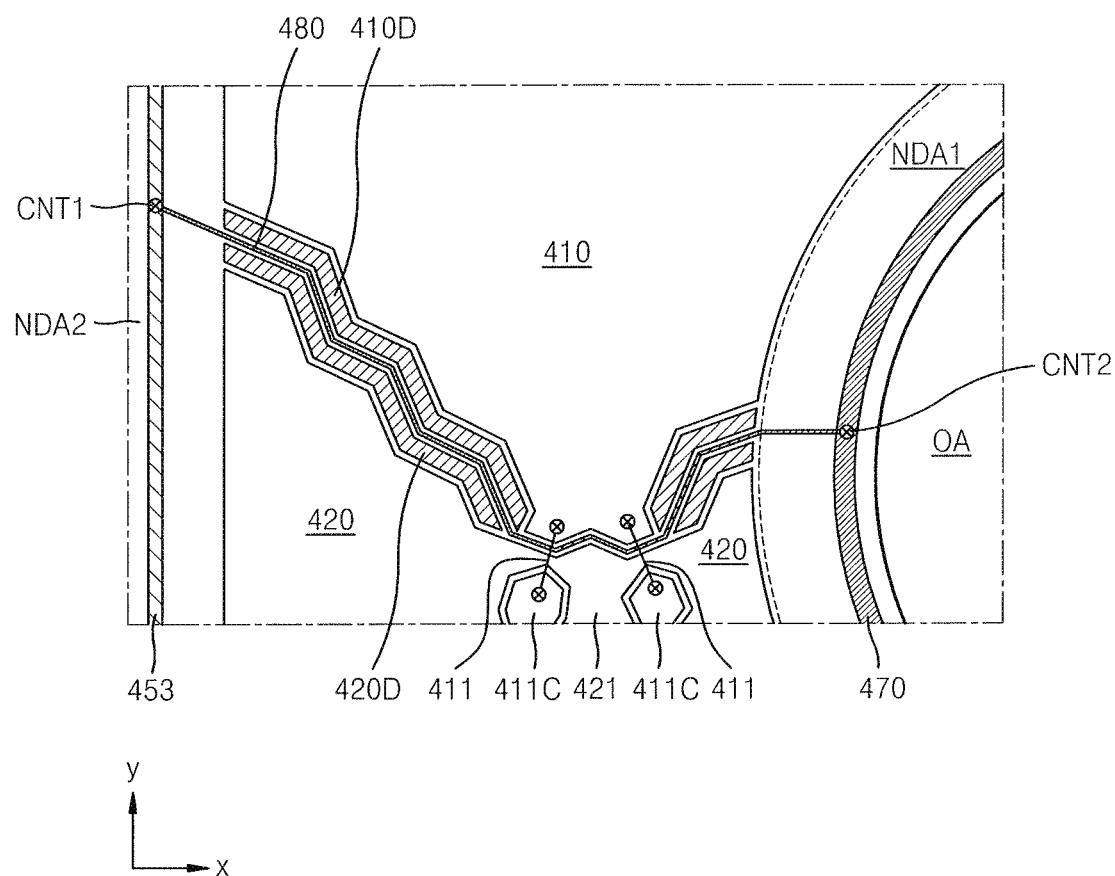
FIG. 23 illustrates a plan view of a structure around the first line in the input detecting layer, according to another example embodiment.
Figure 24:
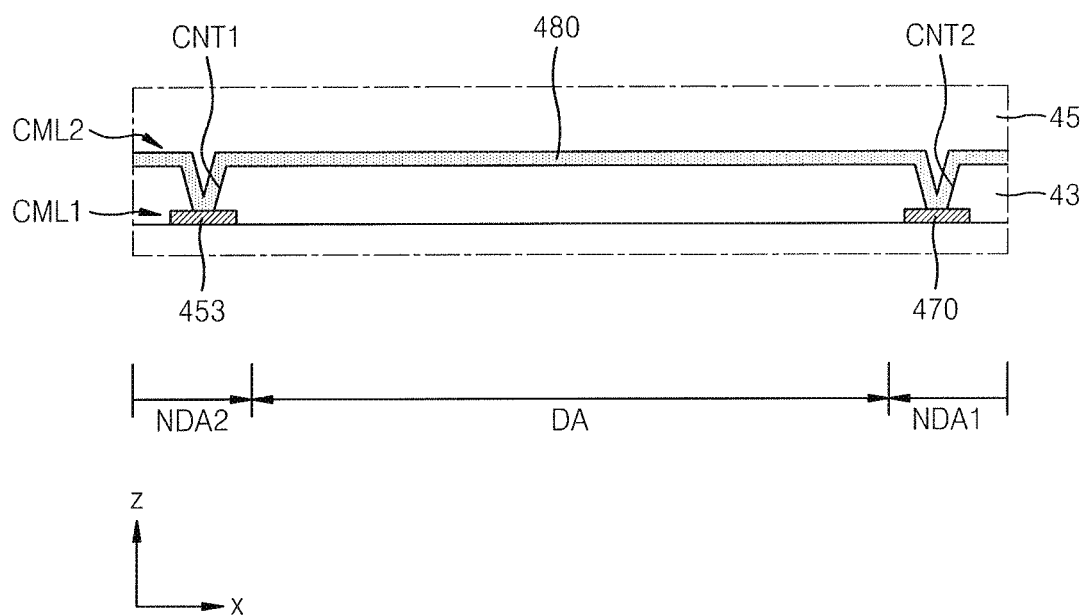
FIG. 24 illustrates a cross-sectional view taken along an extending direction of a connecting line of FIG. 23.

FIG. 23 is a plan view of a structure around the first line 470 in the input detecting layer 40, according to another example embodiment, and FIG. 24 is a cross-sectional view taken along an extending direction of the connecting line 480 of FIG. 23. Although not shown in FIG. 23, a connecting electrode sector described above with reference to FIG. 13 may be arranged in the first non-display area NDA1.

Referring to FIGS. 23 and 24, features of the first line 470 are the same as those described above with reference to FIGS. 14 and 15C, except that the first line 470 is connected to the third guard line 453 by the connecting line 480. The first line 470 is located in the first non-display area NDA1 while surrounding the opening area OA and the third guard line 453 is located in the second non-display area NDA2.

For example, the first conductive layer CML1 may include the third guard line 453, the first line 470, and the first connecting electrode 411. The second conductive layer CML2 may include the first and second detecting electrodes 410 and 420, the first and second dummy electrodes 410D and 420D, the intervening electrode 411C, the second connecting electrode 421, and the connecting line 480. The connecting line 480 may be connected to the third guard line 453 and the first line 470 respectively through the first and second contact holes CNT1 and CNT2 provided in the first insulating layer 43 provided between the first and second conductive layers CML1 and CML2.

In FIG. 23, the connecting line 480 is included in the second conductive layer CML2, as an example. According to another example embodiment, the connecting line 480 may be included in the first conductive line CML1 as described above with reference to FIG. 16, and the connecting line 480, the third guard line 453, and the first line 470 may be provided as a single body. According to another example embodiment, the connecting line 480 may be included in the first conductive layer CML1 as described above with reference to FIG. 18 while overlapping at least one of the first or second detecting electrode 410 or 420. According to another example embodiment, the connecting line 480 may be included in the second conductive layer CML2 as described above with reference to FIG. 20 and may pass between the first and second sub-detecting electrodes 420A and 420B.

By way of summation and review, various functions connected or linked to display devices are being added, while areas occupied by display areas in the display devices are being enlarged. Consideration has been given to forming an opening in a display area in connection with enlarging areas while adding various functions.

In a display device including an opening or an opening area, external electrostatic discharge (ESD) may be introduced through the opening or the opening area, and in this case, an electrode or wire (or line) for detecting a touch input applied to the display device may be damaged by ESD.

As described above, embodiments may provide a display device configured to help prevent an input detecting layer and components around the input detecting layer from being damaged by ESD introduced through an opening area or an opening.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a substrate including an opening penetrating the substrate, a display area, a first non-display area between the opening and the display area, and a second non-display area spaced apart from the first non-display area with the display area therebetween;
    a plurality of display elements arranged in the display area;
    an encapsulation member on the plurality of display elements, the encapsulation member covering the display area and the first non-display area;
    a plurality of first detecting electrodes arranged on the encapsulation member in a first direction;
    a plurality of second detecting electrodes arranged on the encapsulation member in a second direction crossing the first direction; and
    a first line placed on the encapsulation member and made of an electrically-conductive material, the first line being in the first non-display area between the opening and the display area in a plan view.

2. The display device as claimed in claim 1, wherein the first line has a constant voltage level.

3. The display device as claimed in claim 1, further comprising:
    a second line of an electrically-conductive material in the second non-display area; and
    a connecting line electrically connecting the first line to the second line.

4. The display device as claimed in claim 3, wherein the connecting line is located on a same layer as the first detecting electrodes.

5. The display device as claimed in claim 4, further comprising an insulating layer provided between the connecting line and any one of the first line and the second line, wherein
    the connecting line is connected to the any one of the first line and the second line via a contact hole of the insulating layer.

6. The display device as claimed in claim 3, wherein the connecting line is located on a same layer as any one of the first line and the second line.

7. The display device as claimed in claim 6, wherein the connecting line includes a metal layer.

8. The display device as claimed in claim 3, wherein the connecting line is located in a gap between neighboring detecting electrodes among the first detecting electrodes and the second detecting electrodes.

9. The display device as claimed in claim 3, wherein the connecting line overlaps at least one of the first detecting electrodes or the second detecting electrodes.

10. The display device as claimed in claim 1, wherein the first detecting electrodes and the second detecting electrodes respectively include a transparent conductive layer.

11. The display device as claimed in claim 10, wherein the first line includes a material different from the first detecting electrodes and the second detecting electrodes.

12. The display device as claimed in claim 1, wherein the first detecting electrodes and the second detecting electrodes respectively include a metal layer.

13. The display device as claimed in claim 1, further comprising a connecting electrode sector connecting neighboring first detecting electrodes among the first detecting electrodes or neighboring second detecting electrodes among the second detecting electrodes.

14. The display device as claimed in claim 1, wherein:
    the opening includes a first arc shape, and
    the first line has a second arc shape that parallels the first arc shape of the opening as the first line circumvents the opening.

15. The display device as claimed in claim 1, wherein the first line surrounds more than half of the opening.

16. The display device as claimed in claim 15, wherein the first line completely surrounds the opening.

17. The display device as claimed in claim 16, wherein the first non-display area includes:
    a first connecting electrode sector electrically connecting neighboring first detecting electrodes among the first detecting electrodes, and
    a second connecting electrode sector electrically connecting neighboring second detecting electrodes among the first detecting electrodes.

18. The display device as claimed in claim 17, wherein the first connecting electrode sector and the second connecting electrode sector are both arranged around and circumventing the first line.

* * * * *